United States Patent
Park

(10) Patent No.: US 10,424,619 B2
(45) Date of Patent: Sep. 24, 2019

(54) VARIABLE RESISTANCE MEMORY DEVICES AND METHODS OF MANUFACTURING THE SAME

(71) Applicant: Samsung Electronics Co., Ltd., Suwon-si, Gyeonggi-do (KR)

(72) Inventor: Ilmok Park, Seoul (KR)

(73) Assignee: Samsung Electronics Co., Ltd. (KR)

(*) Notice: Subject to any disclaimer, the term of this patent is extended or adjusted under 35 U.S.C. 154(b) by 103 days.

(21) Appl. No.: 15/247,987

(22) Filed: Aug. 26, 2016

(65) Prior Publication Data

US 2017/0200768 A1    Jul. 13, 2017

(30) Foreign Application Priority Data

Jan. 13, 2016 (KR) .................. 10-2016-0004339
Mar. 23, 2016 (KR) .................. 10-2016-0034787

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/04* (2013.01); *H01L 45/06* (2013.01); *H01L 45/126* (2013.01); *H01L 45/1233* (2013.01); *H01L 45/141* (2013.01); *H01L 45/1666* (2013.01); *H01L 45/144* (2013.01); *H01L 45/1683* (2013.01)

(58) Field of Classification Search
CPC ............. H01L 21/8221; H01L 27/0611; H01L 27/0668; H01L 27/11507–27/11536; H01L 27/11551; H01L 27/1156–27/1158; H01L 27/11597; H01L 27/1203; H01L 27/11548; H01L 27/11558; H01L 27/115
See application file for complete search history.

(56) References Cited

U.S. PATENT DOCUMENTS

| | | | |
|---|---|---|---|
| 7,569,845 B2 | 8/2009 | Chen et al. | |
| 7,709,822 B2 | 5/2010 | Karpov et al. | |
| 7,939,815 B2 | 5/2011 | Lee et al. | |
| 8,084,789 B2 | 12/2011 | Pellizzer et al. | |
| 8,173,987 B2 | 5/2012 | Lung | |
| 8,404,514 B2 | 3/2013 | Lee et al. | |
| 9,029,826 B2 | 5/2015 | Chang et al. | |
| 9,159,915 B2 | 10/2015 | Karpov et al. | |
| 2009/0242865 A1* | 10/2009 | Lung ...................... | H01L 27/24 257/2 |
| 2010/0108974 A1* | 5/2010 | Park ................... | H01L 27/2409 257/3 |
| 2010/0117048 A1* | 5/2010 | Lung .................. | G11C 13/0004 257/4 |
| 2010/0176365 A1 | 7/2010 | Park et al. | |
| 2010/0308296 A1 | 12/2010 | Pirovano et al. | |
| 2011/0103133 A1* | 5/2011 | Okada ................... | H01L 27/101 365/148 |

(Continued)

*Primary Examiner* — Cuong B Nguyen
(74) *Attorney, Agent, or Firm* — Myers Bigel, P.A.

(57) ABSTRACT

Variable resistance memory devices are provided. A variable resistance memory device includes first and second conductive lines, and a variable resistance material and a switching element between the first and second conductive lines. The switching element includes first and second portions that extend and/or face in different first and second directions, respectively. Methods of manufacturing a variable resistance memory device are also provided.

20 Claims, 37 Drawing Sheets

(56) References Cited

U.S. PATENT DOCUMENTS

2013/0058158 A1    3/2013  Pellizer et al.
2014/0183435 A1*   7/2014  Kim ..................... H01L 45/06
                                                          257/4
2016/0260778 A1*   9/2016  Castro ................ H01L 27/2481

* cited by examiner

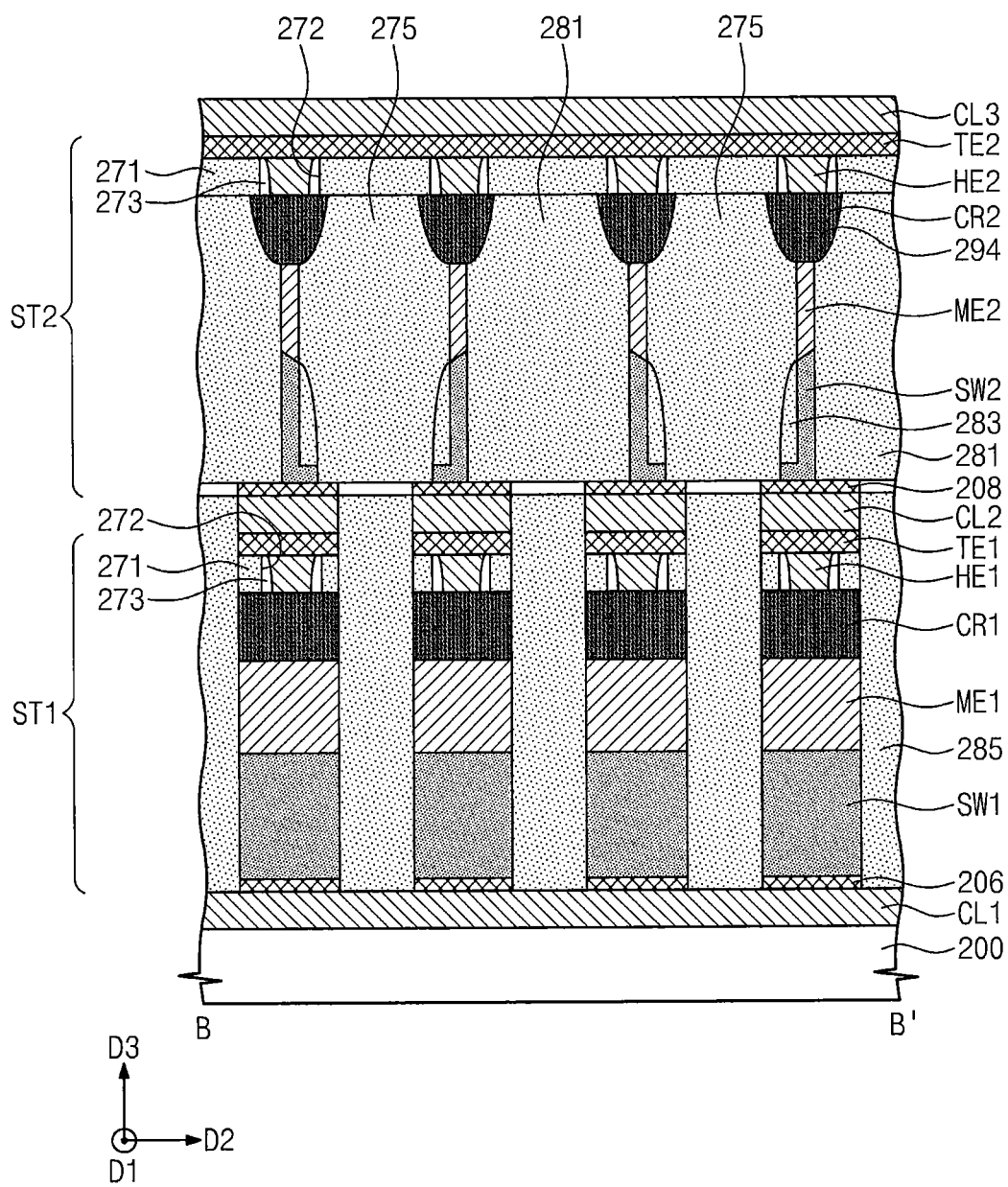

VARIABLE RESISTANCE MEMORY DEVICES AND METHODS OF MANUFACTURING THE SAME

CROSS-REFERENCE TO RELATED APPLICATIONS

This application claims priority under 35 U.S.C. § 119 to Korean Patent Application No. 10-2016-0004339, filed on Jan. 13, 2016, and Korean Patent Application No. 10-2016-0034787, filed on Mar. 23, 2016, in the Korean Intellectual Property Office, the disclosures of which are hereby incorporated by reference herein in their entireties.

BACKGROUND

The present disclosure relates to semiconductor devices and methods of manufacturing the same. Semiconductor devices can be classified into memory devices and logic devices. The memory devices can be classified into volatile memory devices and non-volatile memory devices. The volatile memory devices lose data stored therein when power supply is interrupted. The volatile memory devices include, for example, a dynamic random access memory (DRAM) and a static random access memory (SRAM). The non-volatile memory devices retain data stored therein even when power supply is interrupted. The non-volatile memory devices include, for example, a programmable read only memory (PROM), an erasable PROM (EPROM), an electrically EPORM (EEPROM), and a flash memory device. Also, according to a trend of high performance and low power consumption of the semiconductor memory devices, next generation semiconductor memory devices such a resistive random access memory (ReRAM), magnetic random access memory (MRAM), phase-change random access memory (PRAM) have been developed. Such next generation semiconductor memory devices use a material having a resistance value that can vary according to current or voltage and can retain the resistance value even though power supply is interrupted.

SUMMARY

A variable resistance memory device, according to some embodiments of present inventive concepts, may include first conductive lines extending in a first direction. The variable resistance memory device may include second conductive lines extending in a second direction that intersects the first direction. The second conductive lines may be spaced apart from the first conductive lines in a third direction that is perpendicular to the first and second directions. Moreover, the variable resistance memory device may include first switching elements and first variable resistance structures between the first conductive lines and the second conductive lines. The first switching elements may be spaced apart from the first variable resistance structures in the third direction. The first switching elements each may include a first portion extending in the third direction and a second portion extending in the first direction or the second direction.

A variable resistance memory device, according to some embodiments, may include first conductive lines extending in a first direction. The variable resistance memory device may include second conductive lines and third conductive lines extending in a second direction that intersects the first direction. The second and third conductive lines may be spaced apart from each other in a third direction that is perpendicular to the first and second directions. The first conductive lines may be between the second and third conductive lines. The variable resistance memory device may include switching elements between the first conductive lines and the second conductive lines and between the first conductive lines and the third conductive lines. Moreover, the variable resistance memory device may include variable resistance structures between the first conductive lines and the second conductive lines and between the first conductive lines and the third conductive lines. Each of the switching elements may include an upper portion and a lower portion. The upper portion may extend from the lower portion in the third direction. The upper portion may include a first width that is narrower in the first direction than a second width in the first direction of the lower portion.

A method of forming a variable resistance memory device, according to some embodiments, may include forming conductive layers that are spaced apart from each other on a substrate. The method may include forming first insulating patterns that include first trenches on the substrate. Each of the first trenches may expose a pair of adjacent ones of the conductive layers. The method may include sequentially forming a switching layer and an insulating layer on the first insulating patterns. The switching layer and the insulating layer may be in the first trenches and on top surfaces of the first insulating patterns. The method may include performing an anisotropic etching process to form switching elements and spacer patterns on sidewalls of the switching elements. The switching elements may be on the conductive layers and spaced apart from each other. Moreover, the method may include forming variable resistance structures electrically connected to the switching elements.

A variable resistance memory device, according to some embodiments, may include first and second conductive lines. The variable resistance memory device may include a memory cell that includes a stack. The stack may include a variable resistance material and a switching element that are between the first and second conductive lines. The switching element may include an un-etched first surface facing a first direction and an un-etched second surface facing a second direction that intersects the first direction. Moreover, the variable resistance memory device may include an insulating material on the un-etched first and second surfaces of the switching element.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 23A and 23B illustrate a variable resistance memory device according to example embodiments of present inventive concepts and are cross-sectional views taken along lines A-A' and B-B' of FIG. 3, respectively.

DETAILED DESCRIPTION

Figure 1:
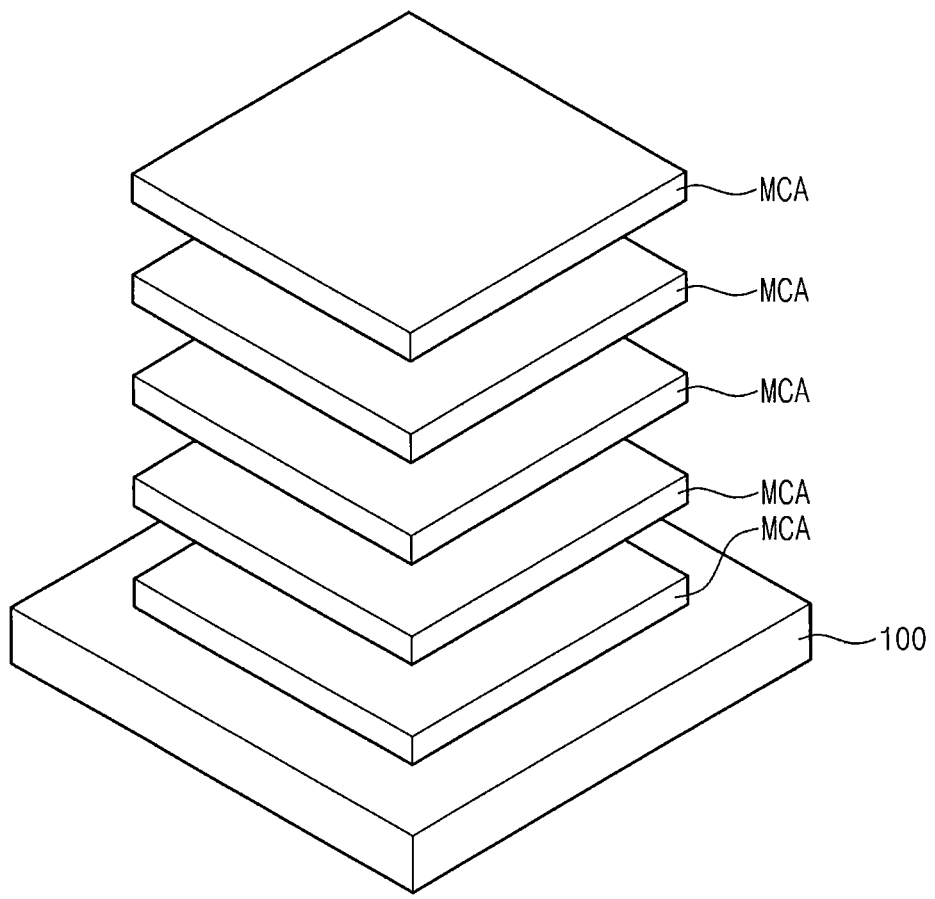
FIG. 1 is a conceptual view illustrating a variable resistance memory device according to example embodiments of present inventive concepts.

FIG. 1 is a conceptual view illustrating a variable resistance memory device according to example embodiments of present inventive concepts.

Referring to FIG. 1, a variable resistance memory device according to example embodiments of present inventive concepts may include a plurality of memory cell stacks MCA that are stacked on a substrate 100. The memory cell stacks MCA may each include a plurality of variable resistance cells arranged two-dimensionally. The variable resistance memory device may include a plurality of conductive lines that are disposed between the memory cell stacks MCA and are used for write, read, and erase operations of the memory cells. Although five memory cell stacks are shown in FIG. 1, aspects of present inventive concepts are not limited thereto. For example, two, three, four, six, seven, eight, or more memory cell stacks may be used.

Figure 2:
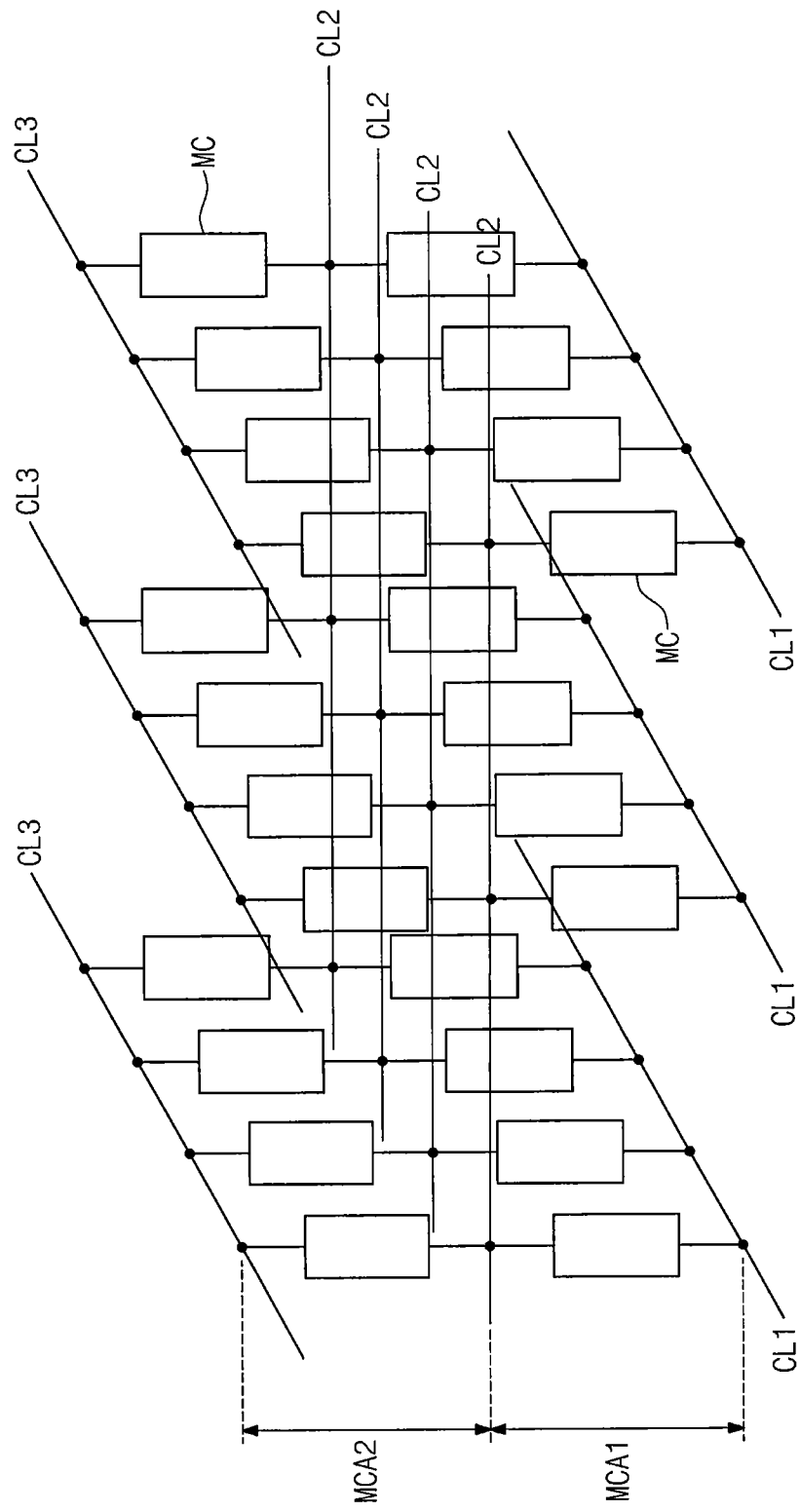
FIG. 2 is a circuit diagram illustrating memory cell stacks of FIG. 1.

FIG. 2 is a circuit diagram illustrating memory cell stacks of FIG. 1. FIG. 2 illustrates, for example, two adjacent memory cell stacks MCA.

Referring to FIG. 2, a first memory cell stack MCA1 may include memory cells MC which are disposed at respective intersections of first conductive lines CL1 and second conductive lines CL2. A second memory cell stack MCA2 may include memory cells MC which are disposed at respective intersections of the second conductive lines CL2 and third conductive lines CL3. The memory cells MC included in each of the first and second memory cell stacks MCA1 and MCA2 may be two-dimensionally arrayed in rows and columns on the substrate 100 of FIG. 1. The memory cells MC may each include a switching element and a variable resistance structure.

In embodiments in which the first conductive line CL1 is disposed between the second conductive line CL2 and the substrate 100, in each memory cell MC, the switching element may be provided between the variable resistance structure and the substrate 100. Alternatively, in each memory cell MC, the variable resistance structure may be provided between the switching element and the substrate 100. The switching element may be positioned at each intersection of the first conductive lines CL1 and second conductive lines CL2 and may be physically separated from adjacent switching elements positioned respectively at neighboring intersections of the first conductive lines CL1 and the second conductive lines CL2. The variable resistance structure may be positioned at each intersection of the first conductive lines CL1 and second conductive lines CL2 and may be physically separated from the adjacent variable resistance structures positioned respectively at neighboring intersections of the first conductive lines CL1 and the second conductive lines CL2. Alternatively, a variable resistance structure which is physically configured into one structure may be shared by a plurality of the memory cells MC. For example, when shown in plan view, the variable resistance structure may have a linear shape that extends in a direction parallel to an extension direction of the first conductive line CL1 or the second conductive line CL2.

Figure 3:
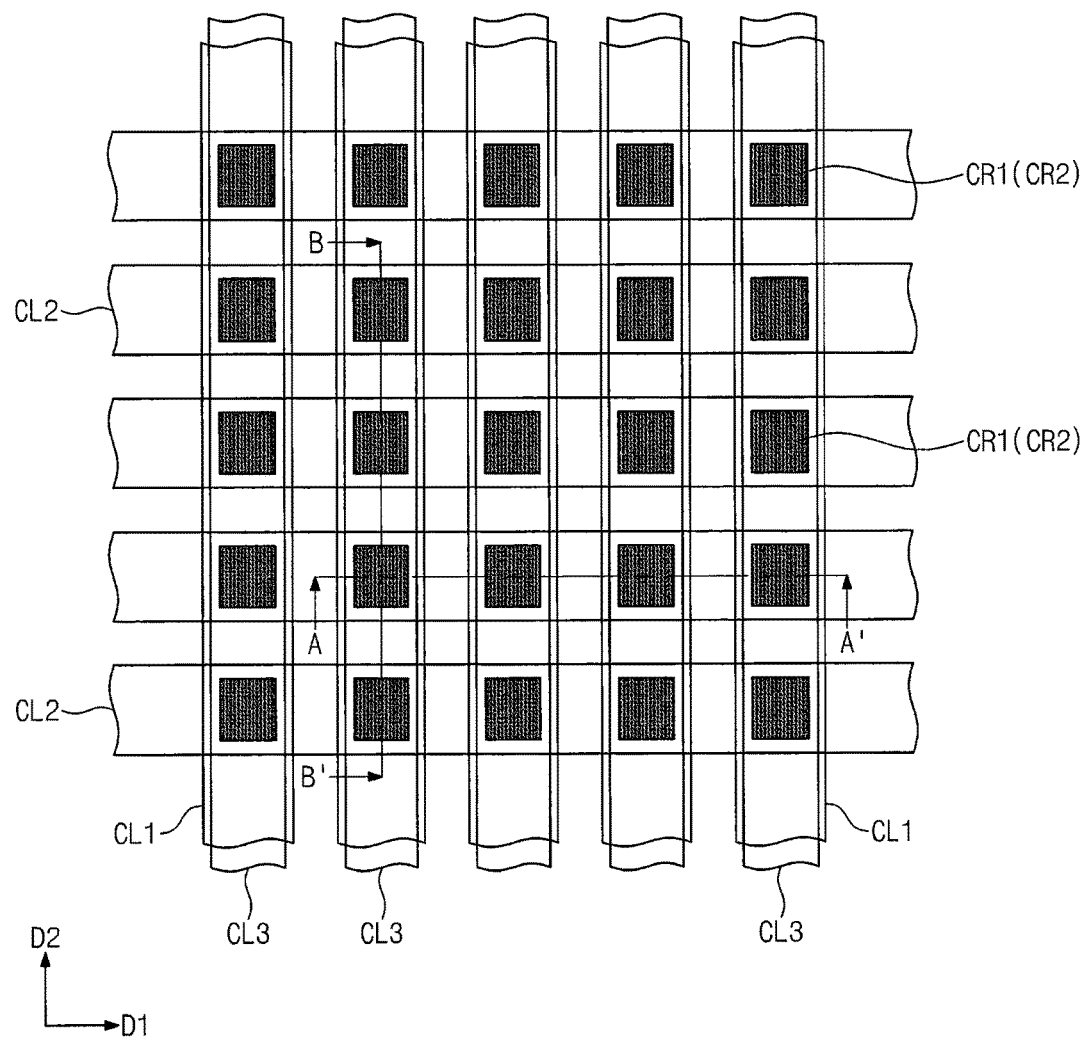
FIG. 3 is a plan view illustrating a variable resistance memory device according to example embodiments of present inventive concepts.
Figure 4A:
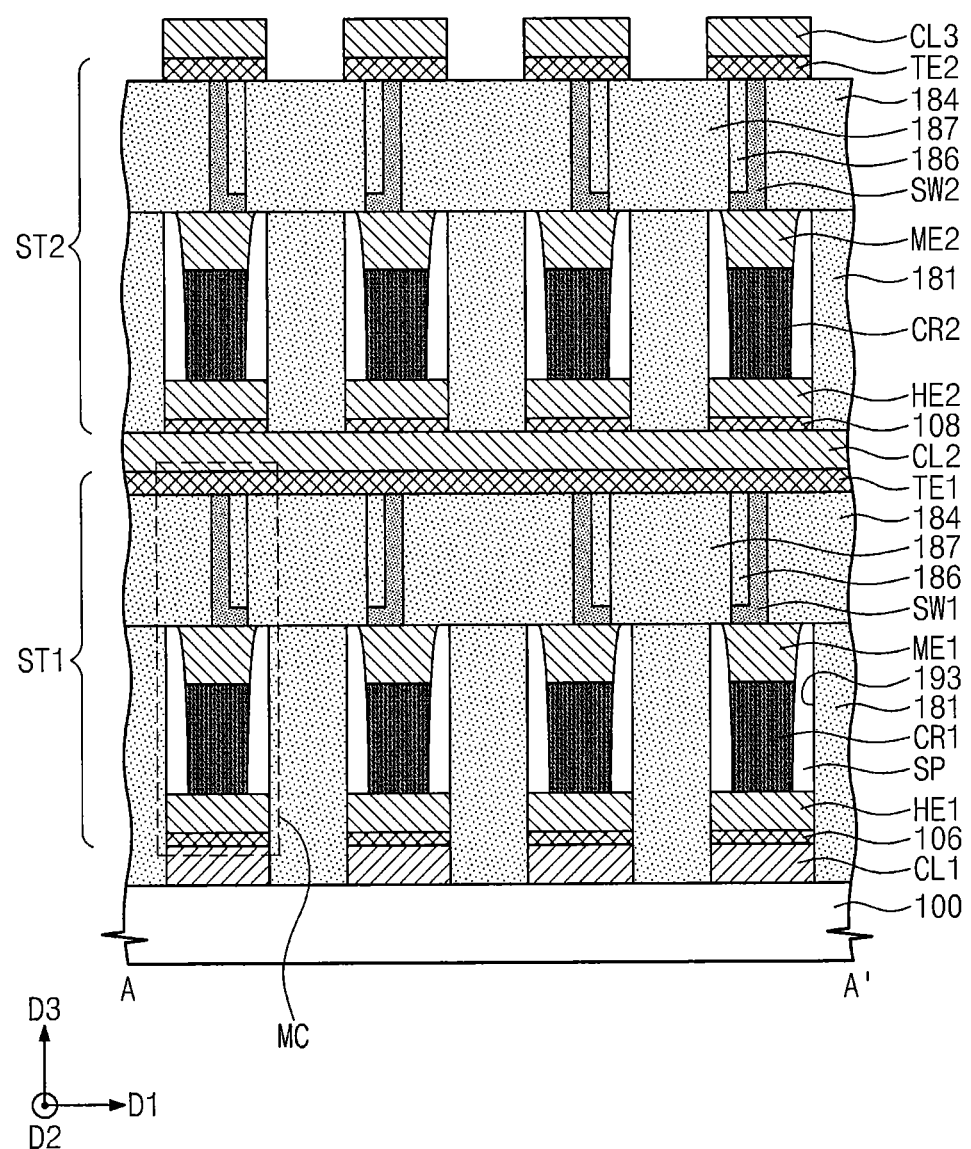
FIGS. 4A and 4B are cross-sectional views taken along lines A-A' and B-B' of FIG. 3, respectively.
Figure 4B:
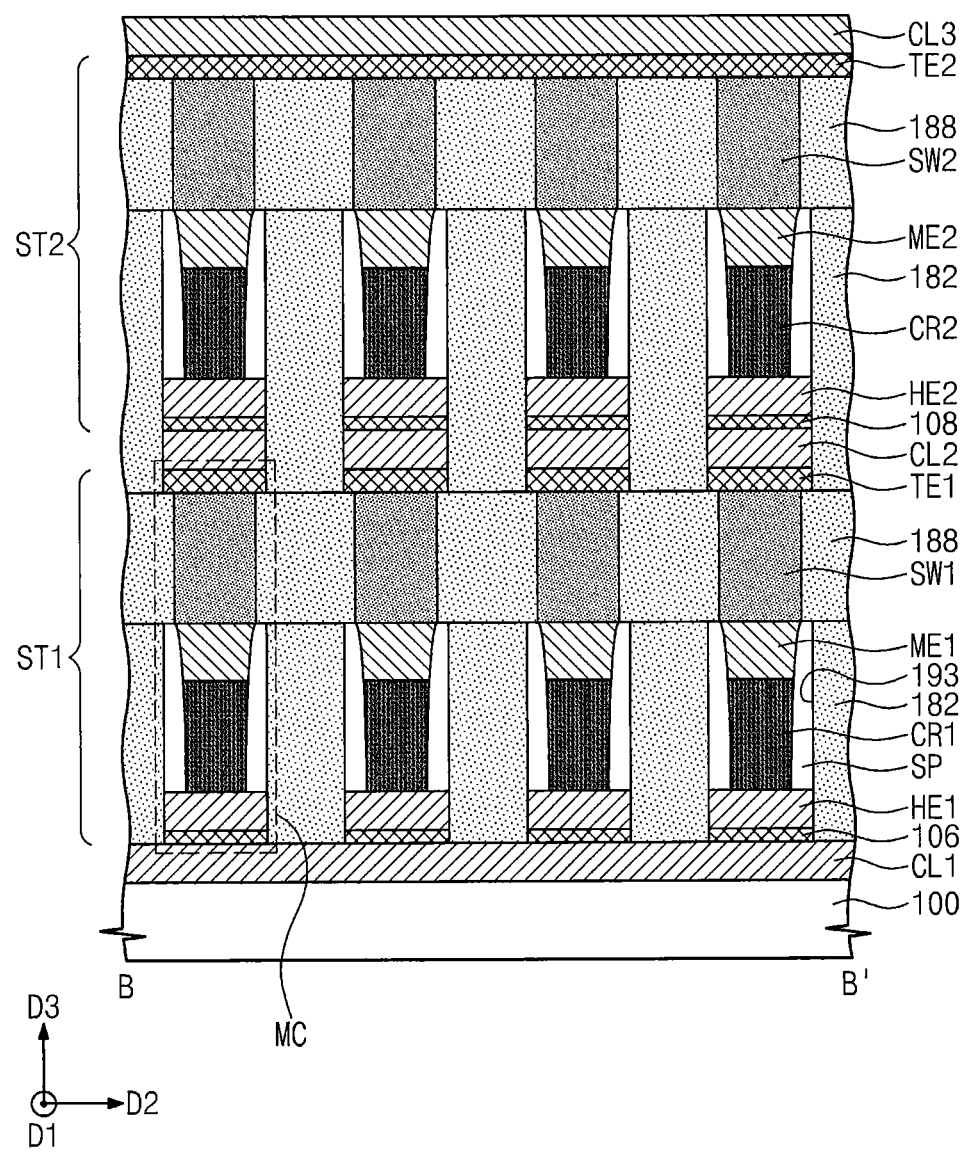

FIG. 3 is a plan view illustrating a variable resistance memory device according to example embodiments of present inventive concepts. FIGS. 4A and 4B are cross-sectional views taken along lines A-A' and B-B' of FIG. 3, respectively.

Referring to FIGS. 3, 4A, and 4B, a first cell stack ST1 and a second cell stack ST2 may be sequentially provided on the substrate 100 in a direction D3 vertical to a top surface of the substrate 100. The first and second cell stacks ST1 and ST2 may correspond to the memory cell stacks MCA described with reference to FIGS. 1 and 2. For convenience's sake, two cell stacks are illustrated, however, three or more cell stacks may be provided on the substrate 100. In this case, structures corresponding to the first cell stack ST1 and the second cell stack ST2 may be repeatedly and alternately stacked on each other.

The first cell stack ST1 may be disposed between the first conductive lines CL1 and the second conductive lines CL2 which are sequentially provided on the substrate 100 to be vertically spaced apart from each other. The first conductive lines CL1 may extend in a first direction D1 parallel to the top surface of the substrate 100, and the second conductive lines CL2 may extend in a second direction D2 crossing the first direction D1 and parallel to the top surface of the substrate 100. The first and second conductive lines CL1 and CL2 may include a conductive material (e.g., metal) such as copper (Cu) or aluminum (Al). The first and second conductive lines CL1 and CL2 may further include a conductive metal nitride such as titanium nitride (TiN) or tungsten nitride (WN).

The first cell stack ST1 may include memory cells MC which are positioned at respective intersections of the first conductive lines CL1 and the second conductive lines CL2. The memory cells MC may each include a variable resistance structure CR1 and a switching element SW1. The variable resistance structure CR1 may be referred to herein as a "variable resistance material" or a "variable resistance element." The memory cells MC may each include an intermediate electrode ME1 between the variable resistance structure CR1 and the switching element SW1. The variable resistance structure CR1 may be disposed between the switching element SW1 and the substrate 100. Alternatively, the switching element SW1 may be disposed between the variable resistance structure CR1 and the substrate 100. Hereafter, for convenience of explanation, it will be described that the variable resistance structure CR1 is disposed between the switching element SW1 and the substrate 100. However, aspects of example embodiments of present inventive concepts are not limited thereto.

The variable resistance structure CR1 may be provided in hole (e.g., recess) regions 193 which are formed in first and second inter layer insulating layers 181 (refer to FIG. 4A) and 182 (refer to FIG. 4B) on the substrate 100. When shown in plan view, the hole regions 193 may be disposed at respective intersections of the first conductive lines CL1 and the second conductive lines CL2 to be two-dimensionally arranged. In some embodiments, the variable resistance structures CR1 may each have a linear shape extending along the first direction D1 or the second direction D2. In this case, a single variable resistance structure CR1 may be shared by a plurality of the memory cells MC. Spacers SP may be disposed on sidewalls of the hole regions 193, and the variable resistance structures CR1 may be spaced apart from the first and second insulating layers 181 and 182 with the spacers SP disposed therebetween. The spacers SP may include at least one of silicon oxide, silicon nitride, and silicon oxynitride.

The variable resistance structures CR1 may include at least one of various materials capable of storing information. In embodiments where the variable resistance memory device is a phase change memory device (PRAM), the variable resistance structures CR1 may include a material capable of a reversible phase change between a crystalline phase and an amorphous phase depending on temperature. For example, a phase change temperature between a crystalline phase and an amorphous phase of the variable resistance structures CR1 may be in a range of about 250° C. to about 350° C. The variable resistance structures CR1 may include a compound formed by combination of at least one of chalcogen elements, for example, Tellurium (Te) and Selenium (Se) and at least one of Germanium (Ge), Antimony (Sb), Bismuth (Bi), Lead (Pb), Tin (Sn), Silver (Ag), Arsenic (As), Sulfur (S), Silicon (Si), Indium (In), Titanium (Ti), Gallium (Ga), Phosphorus (P), Oxygen (O) and Carbon (C). For example, the variable resistance structures CR1 may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. In some embodiments, the variable resistance structures CR1 may include a super-lattice structure in which a layer containing Ge and a layer free of Ge are repeatedly and alternately stacked on each other. For example, the variable resistance structures CR1 may include a structure in which a GeTe layer and SnTe layer are repeatedly and alternately stacked on each other.

In some embodiments, the variable resistance structures CR1 may include at least one of perovskite compound materials and conductive metal oxides. For example, the variable resistance structures CR1 may include at least one of niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, and barium-strontium-zirconium oxide. When the variable resistance structures CR1 include a transition metal oxide, a dielectric constant of each of the variable resistance structures CR1 may be greater than that of silicon oxide. In some embodiments, the variable resistance structures CR1 may include a double-layered structure formed of a conductive metal oxide layer and a tunnel insulating layer or a triple-layered structure formed of a first conductive metal oxide layer, a tunnel insulating layer, and a second conductive metal oxide layer. The tunnel insulating layer may include aluminum oxide, hafnium oxide, and/or silicon oxide.

First electrodes HE1 may be disposed between the first conductive lines CL1 and the variable resistance structures CR1. When shown in plan view, the first electrodes HE1 may be disposed at respective intersections of the first conductive lines CL1 and the second conductive lines CL2 to be two-dimensionally arrayed. The first electrodes HE1 may function as heater electrodes for heating the variable resistance structures CR1 so as to change phases of the variable resistance structures CR1. The first electrodes HE1 may be formed of a material whose resistivity is greater than that of the first conductive lines CL1. The first electrodes HE1 may include at least one of Tungsten (W), Ti, Al, Cu, C, CN, TiN, TiAlN, TiSiN, TiCN, WN, CoSiN, WSiN, Tantalum Nitride (TaN), TaCN, TaSiN, and TiO.

Barrier patterns 106 may be disposed between the first electrodes HE1 and the first conductive lines 106. The barrier patterns 106 may include at least one of W, Ti, Al, Cu, C, CN, TiN, TiAlN, TiSiN, TiCN, WN, CoSiN, WSiN, TaN, TaCN, and TaSiN. The barrier patterns 106 may be separate respective patterns under the first electrodes HE1. However, in comparison with FIGS. 4A and 4B, the barrier patterns 106 may be configured to be one pattern extending along (or extending parallel to) the first conductive lines CL1. In some embodiments, the barrier patterns 106 may be omitted.

The variable resistance structures CR1 may each be disposed in a lower portion of each of the hole regions 193, and the intermediate electrodes ME1 may each be disposed in an upper portion of each of the hole regions 193. The intermediate electrodes ME1 may electrically connect the variable resistance structures CR1 and the switching elements SW1 and may impede/prevent a direct contact between the variable resistance structures CR1 and the switching elements SW1. The intermediate electrodes ME1 may include at least one of W, Ti, Al, Cu, C, CN, TiN, TiAlN, TiSiN, TiCN, WN, CoSiN, WSiN, TaN, TaCN, and TaSiN.

The switching elements SW1 may be disposed in insulating patterns on the first and second insulating layers 181 (refer to FIG. 4A) and 182 (refer to FIG. 4B). For example, the insulating patterns may be first through fourth insulating patterns 184, 186, 187 (refer to FIG. 4A), and 188 (refer to FIG. 4B). For example, the insulating patterns 184, 186, 187, and 188 may include at least one of a silicon oxide layer, a silicon nitride layer, and a silicon oxynitride layer. Lower portions of the switching elements SW1 may be connected to the intermediate electrodes ME1 and upper portions of the switching elements SW1 may be connected to second electrodes which will be described later, but are not limited thereto. A pair of the adjacent switching elements SW1 may be mirror-symmetrical to each other. The second insulating patterns 186 may be disposed on opposing/facing sidewalls of the pair of the mirror-symmetrical switching elements SW1 to be spaced apart from each other in the first direction D1. The switching elements SW1 may each expose a portion of a top surface of a respective one of the variable resistance structures CR1 thereunder. In some embodiments, the switching elements SW1 may each cover an entire top surface of the respective one of the variable resistance structures CR1 thereunder.

The switching elements SW1 may be ovonic threshold switch/switching (OTS) elements that have a bidirectional property. As an example, the switching elements SW1 may be elements based on a threshold switching phenomenon having a non-linear (e.g., S-shaped) I-V curve. The switching elements SW1 may have a phase transition temperature between crystalline phase and amorphous phase greater than that of the variable resistance elements CR1. For example, the phase transition temperature may be in a range of 350° C. to 450° C. Accordingly, when the variable resistance memory according to example embodiments is operated, the variable resistance structures CR1 may be reversibly phase-changed between crystalline phase and amorphous phase upon application of operating voltage, but the switching elements SW1 may maintain a substantially amorphous phase without a phase change. Herein, the substantially amorphous phase may include states in which a grain boundary locally exists in a portion of an object and a locally crystallized portion exists in the object.

The switching elements SW1 may include a compound formed by combination of at least one of chalcogen elements, for example, Te and Se and at least one of Ge, Sb, Bi, Al, Pb, Sn, Ag, As, S, Si, In, Ti, Ga and P. The switching elements SW1 may further include a thermally stabilizing element, for example, at least one of C, Nitrogen (N), and O. For example, the switching elements SW1 may include at least one of AsTe, AsSe, GeTe, SnTe, GeSe, SnTe, SnSe, Zinc Telluride (ZnTe), AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiTe.

Hereinafter, a shape of the switching element SW1 will be described.

Figure 5A:
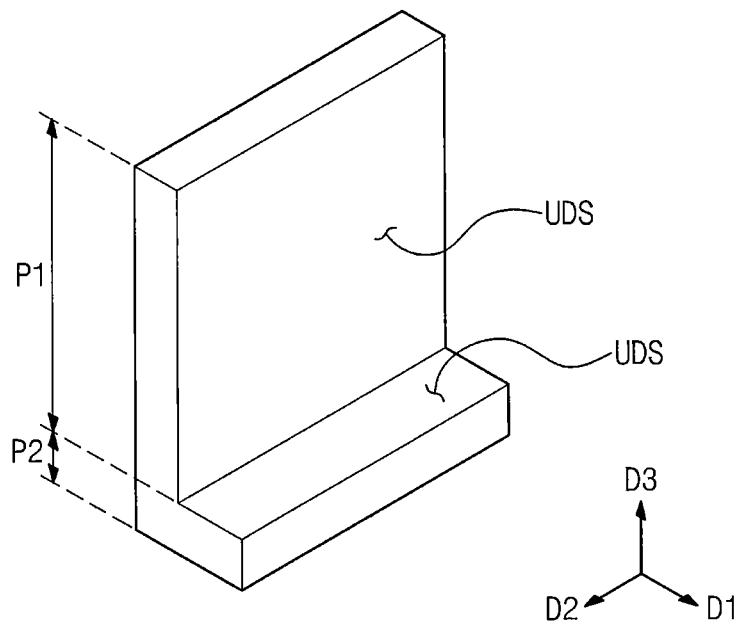
FIGS. 5A and 5B are respective perspective views illustrating a switching element according to example embodiments of present inventive concepts.
Figure 5B:
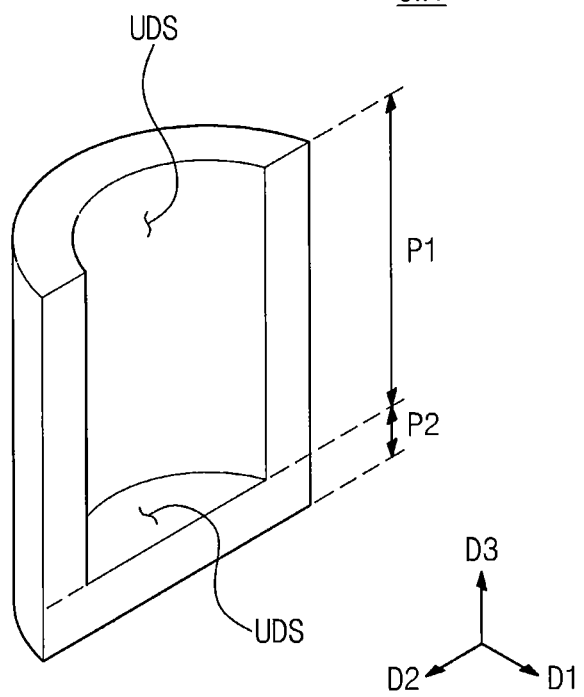

FIGS. 5A and 5B are perspective views illustrating the switching element SW1 according to example embodiments of present inventive concepts.

Referring to FIGS. 5A and 5B, the switching element SW1 may include a first portion P1 extending in a third direction D3 and a second portion P2 laterally extending from a lower portion of the first portion P1. The first portion P1 may extend from an edge of the second portion P2 in the third direction D3. The third direction D3 may be perpendicular to the first and second directions D1 and D2. A thickness (or lateral width) of the first portion P1 may be equal to a thickness (or vertical width) of the second portion P2, but is not limited thereto. The second portion P2 may extend in the first direction D1 as shown, but is not limited thereto. For example, the second portion P2 may extend in the second direction D2. The switching element SW1 may have an L-shape at a cross-section according to a plane defined by the first and third directions D1 and D3. As shown in FIG. 5A, the first portion P1 and the second portion P2 may each have a plate shape similar to a cuboid shape. Alternatively, as shown in FIG. 5B, the first portion P1 and the second portion P2 may have a shape similar to a portion of a pipe with a closed-bottom end. In other words, in a cross section according to a plane defined by the first and second directions D1 and D2, the first portion P1 may have a shape similar to a portion of a ring and the second portion P2 may have a shape similar to a portion of a circle.

The switching element SW1 may have an etched surface formed by etching, and may have un-etched surfaces UDS formed without (e.g., protected from) etching. A sidewall of the first portion P1 and a top surface of the second portion P2 of the switching element SW1 may be un-etched surfaces. As used herein, the words "un-etched surface" may refer to a surface that is free of etching damage. In a patterning process for forming the switching element SW1, the sidewall of the first portion P1 and the top surface of the second portion P2 may be protected by the second insulating pattern 186 of FIG. 4A, thereby not being subject to etch damage. Thus, the variable resistance memory device according to example embodiments of present inventive concepts may be protected/prevented from deterioration of switching properties such as a variation of a crystallization temperature of the switching elements and/or a variation of threshold voltages of the switching elements. As illustrated in FIG. 5B, the un-etched surface UDS of the first portion P1 of the switching element SW1 may be a non-planar (e.g., curved) un-etched surface.

Referring again to FIGS. 4A and 4B, second electrodes TE1 may be disposed between the switching elements SW1 and the second conductive lines CL2. The second electrodes TE1 may extend in the first direction D1. The second electrodes TE1 may be arranged in a plurality of the second electrodes TE1 in the second direction D2. The second electrodes TE1 may each be commonly connected to the switching elements SW1 arranged in the first direction D1. In some embodiments, the second electrodes TE1 may be disposed on respective ones of the switching elements SW1 and may be spaced apart from each other to be arranged in two-dimensions. The second electrode TE1 may include at least one of W, Ti, Al, Cu, C, CN, TiN, TiAlN, TiCN, WN, CoSiN, WSiN, TaN, TaCN, and TaSiN. In some embodiments, the second electrodes TE1 may be omitted.

The second cell stack ST2 may include substantially the same structure as that of the first cell stack ST1. As an example, the second cell stack ST2 may include barrier patterns 108, first electrodes HE2, variable resistance structures CR2, intermediate electrodes ME2, switching elements SW2, and second electrodes TE2 which are sequentially disposed on the second conductive lines CL2.

The barrier patterns 108, the first electrodes HE2, the variable resistance structures CR2, the intermediate electrodes ME2, the switching elements SW2, and the second electrodes TE2 of the second cell stack ST2 may be formed by using substantially the same processes as used for forming the barrier patterns 106, the first electrodes HE1, the variable resistance structures CR1, the intermediate electrodes ME1, the switching elements SW1, and the second electrodes TE1 of the first cell stack ST1.

In the first portion P1 and the second portion P2 described with reference to FIGS. 5A and 5B, an extension direction of the second portion P2 of the first cell stack ST1 may be the same as that of the second portion P2 of the second cell stack ST2. However, the second electrodes TE2 of the second cell stack ST2 may extend in the second direction D2 crossing an extension direction of the second electrode TE1 of the first cell stack ST1. In some embodiments, the second electrode TE2 of the second cell stack ST2 may be disposed on respective ones of the switching elements SW2 and may be spaced apart from each other to be arranged in two-dimensions.

In some embodiments, a configuration of an A-A' cross-section of the second cell stack ST2 may be similar to that of a B-B' cross-section of the first cell stack ST1. In other words, a configuration of a cross section of the second cell stack ST2 shown in FIG. 4A and a configuration of a cross-section of the second cell stack ST2 shown in FIG. 4B may be reversed with respect to each other.

Third conductive lines CL3 may be provided on the second cell stack ST2. The third conductive lines CL3 may extend in a direction parallel to the extension direction of the first conductive lines CL1 (or the second direction D2) and may be spaced apart from each other in a direction parallel to the extension direction of the second conductive lines CL2 (or the first direction D1). The third conductive lines CL3 may be vertically spaced apart from the second conductive lines CL2.

Write, read, and erase operations of the memory cells of the first cell stack ST1 may be performed through the first conductive lines CL1 and the second conductive lines CL2, and write, read, and erase operations of the memory cells of the second cell stack ST2 may be performed through the second conductive lines CL2 and the third conductive lines CL3.

According to example embodiments of present inventive concepts, electrical properties of the variable resistance memory device may be improved by the switching element including un-etched surfaces.

FIGS. 6A, 7A, 8A, 9A, 10A, 11A, and 12A illustrate a method of manufacturing a variable resistance memory device according to example embodiments of present inventive concepts and are cross-sectional views taken along line A-A' of FIG. 3, respectively. FIGS. 6B, 7B, 8B, 9B, 10B, 11B, and 12B illustrate a method of manufacturing a variable resistance memory device according to example embodiments of present inventive concepts and are cross-sectional views taken along line B-B' of FIG. 3, respectively.

Figure 6A:
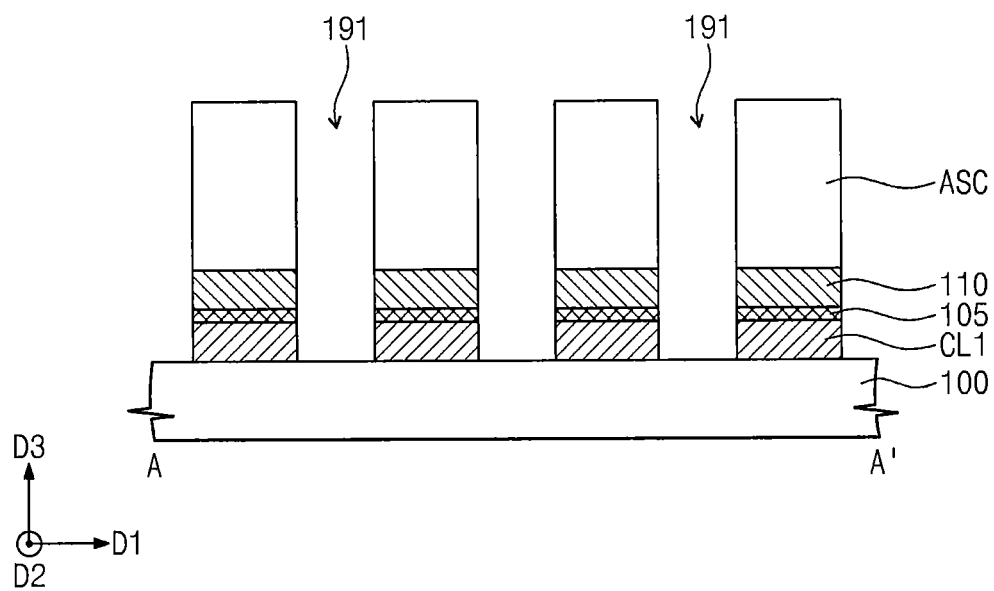
FIGS. 6A, 7A, 8A, 9A, 10A, 11A, and 12A illustrate a method of manufacturing a variable resistance memory device according to example embodiments of present inventive concepts and are cross-sectional views taken along line A-A' of FIG. 3, respectively.
Figure 6B:
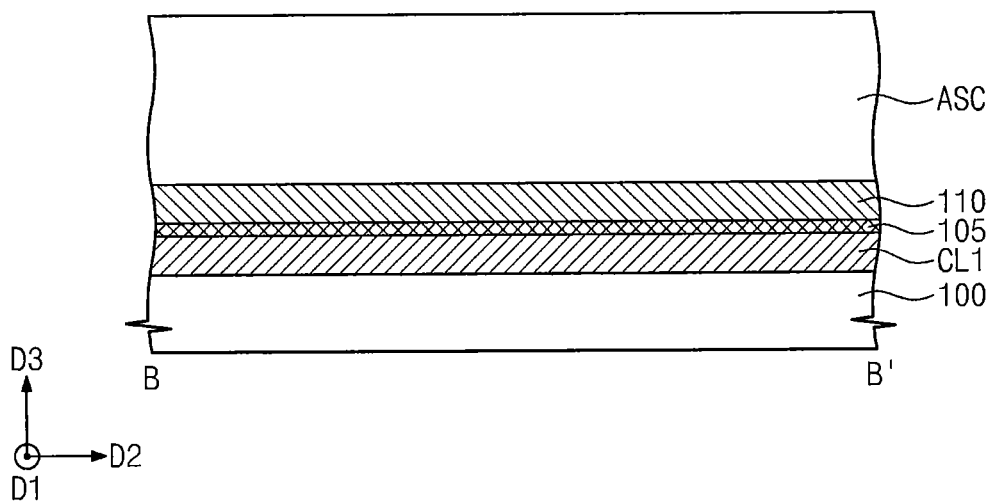
FIGS. 6B, 7B, 8B, 9B, 10B, 11B, and 12B illustrate a method of manufacturing a variable resistance memory device according to example embodiments of present inventive concepts and are cross-sectional views taken along line B-B' of FIG. 3, respectively.

Referring to FIGS. 6A and 6B, first conductive lines CL1, preliminary barrier patterns 105, and preliminary first electrodes 110 may be formed to be sequentially stacked on a substrate 100. The first conductive lines CL1, the preliminary barrier patterns 105, and the preliminary first electrodes 110 may be spaced apart from each other in the first direction D1, respectively, and may extend in the second direction D2. Preliminary sacrificial patterns ASC may be formed on the preliminary first electrode 110 to extend in the second direction D2. For example, the formation of the first conductive lines CL1, the preliminary barrier patterns 105, the preliminary first electrodes 110 may include sequentially depositing a plurality of conductive layers on the substrate 100 and then etching the plurality of conductive layers using the preliminary sacrificial patterns ASC as an etch mask. As a result, first trenches 191 may be formed to separate the first conductive lines CL1 from each other and extend in the second direction D2. The first conductive lines CL1, the preliminary barrier patterns 105, and the preliminary first electrodes 110 may be formed by a single patterning process. In some embodiments, some of the first conductive lines CL1, the preliminary barrier patterns 105, and the preliminary first electrodes 110 may be formed by a separate process. For example, the first conductive lines CL1 may be formed by a damascene process performed separately from the process of forming the preliminary barrier patterns 105 and the preliminary first electrodes 110.

The conductive lines CL1 may include a metal having an improved conductivity, for example, copper (Cu) or aluminum (Al). The preliminary first electrode 110 may include, or may be formed of, a material having a higher resistivity than that of the first conductive lines CL1, for example, at least one of W, Ti, Al, Cu, C, CN, TiN, TiAlN, TiSiN, TiCN, WN, CoSiN, WSiN, TaN, TaCN, TaSiN, and TiO. The preliminary sacrificial patterns ASC may be formed of a material having an etch selectivity with respect to first and second interlayer insulating layers described later. In some embodiments, the formation of the preliminary barrier patterns 105 may be omitted, and thus the first conductive lines CL1 may directly contact the preliminary first electrode 110.

Figure 7A:
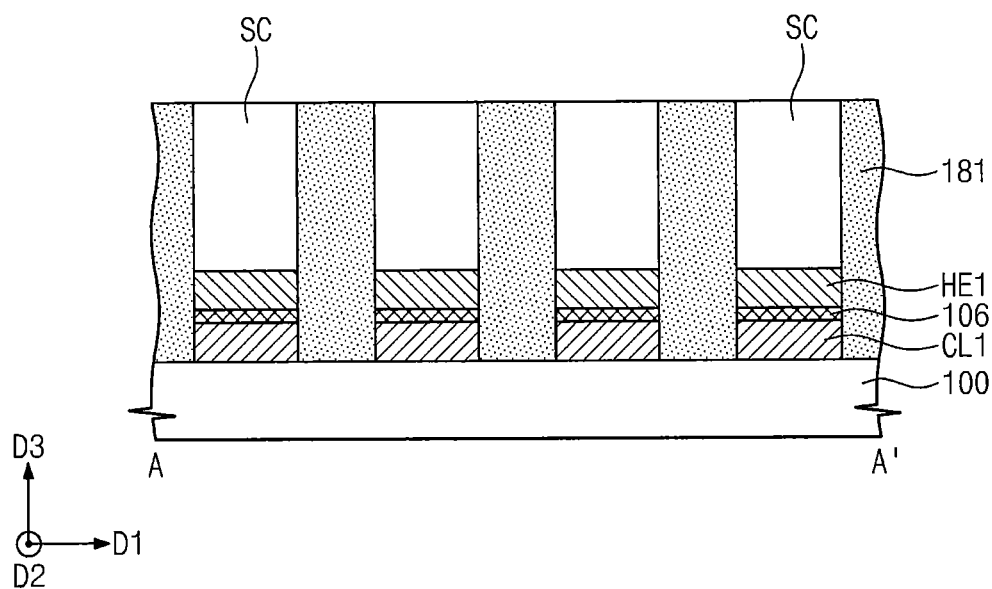
Figure 7B:
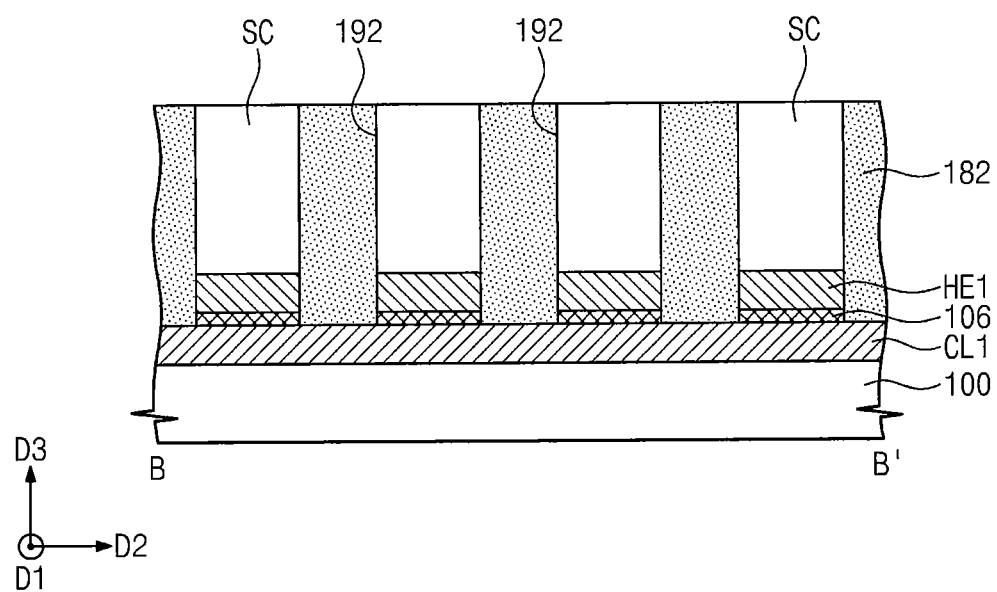

Referring to FIGS. 7A and 7B, after forming a first interlayer insulating layer 181 filling the first trenches 191, the preliminary first electrode 110 and the preliminary barrier patterns 105 may be patterned to form first electrodes HE1 and barrier patterns 106, respectively. The first electrodes HE1 and barrier patterns 106 may be respectively spaced apart from each other in the second direction D2. The patterning process of the preliminary first electrode 110 and the preliminary barrier patterns 105 may include forming mask patterns on the preliminary sacrificial patterns ASC and the first interlayer insulating layer 181 to extend in the first direction D1 and patterning the preliminary sacrificial patterns ASC, the first interlayer insulating layer 181, the preliminary first electrode 110, and the preliminary barrier patterns 105 using the mask pattern as an etch mask to form second trenches 192.

The preliminary sacrificial patterns ASC may be patterned to form sacrificial patterns SC separated from each other in the second direction D2 by the second trenches 192. The second trenches 192 may have bottom surfaces which are substantially coplanar to or higher than top surfaces of the first conductive lines CL1. The first conductive lines CL1 may not be patterned while patterning the preliminary first electrode 110 and the preliminary barrier patterns 105.

After forming a second interlayer insulating layer 182 filling the second trenches 192, a planarization process may be performed on the second interlayer insulating layer 182 until top surfaces of the sacrificial patterns SC are exposed. The first and second insulating layers 181 and 182 may be formed of at least one of silicon oxide, silicon nitride, and silicon oxynitride.

Figure 8A:
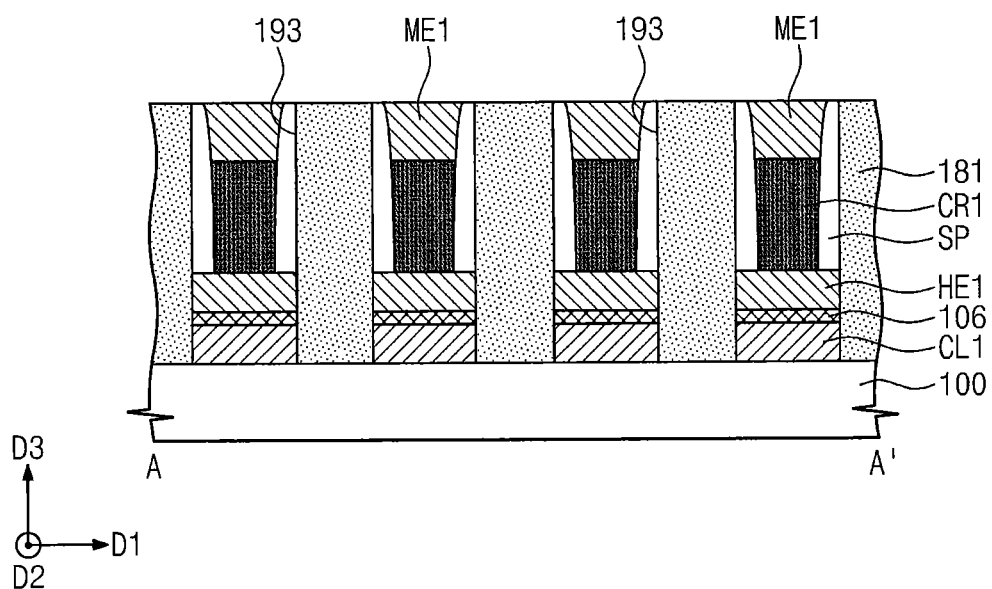
Figure 8B:
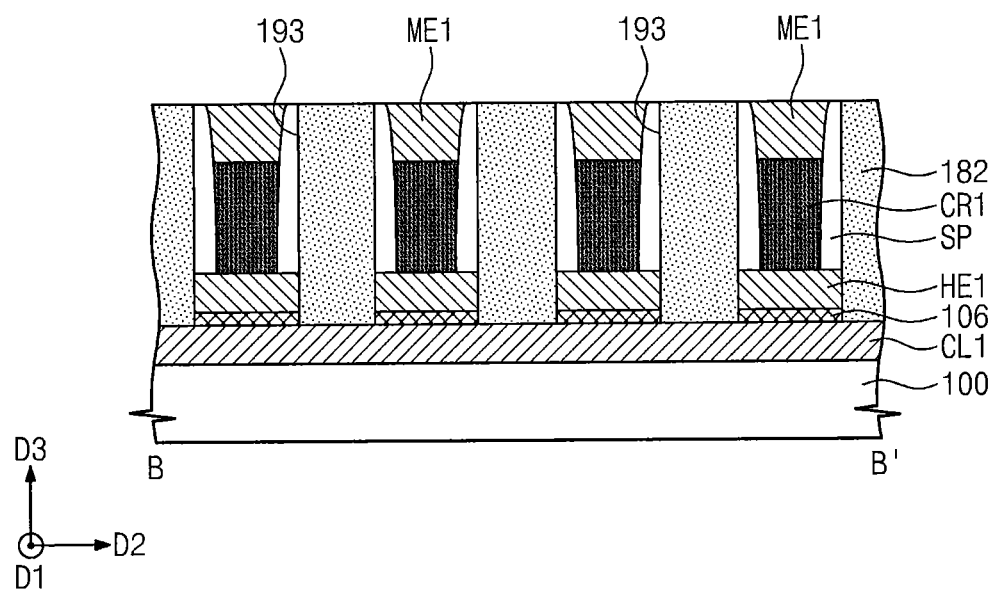

Referring to FIGS. 8A and 8B, the sacrificial patterns SC may be selectively removed to form hole regions 193 on the substrate 100. The hole regions 193 may be spaced apart from each other in the first and second directions D1 and D2. As an example, in embodiments where the first and second interlayer insulating layers 181 and 182 include a silicon nitride layer and/or a silicon oxynitride layer and the sacrificial patterns SC include a silicon oxide layer, the sacrificial patterns SC may be removed using an etchant containing phosphoric acid.

Spacers SP may be formed on sidewalls of the hole regions 193. The spacers SP may be formed by conformally forming an insulating layer on the substrate 100 and then performing an anisotropic etching process on the insulating layer. The spacers SP may include at least one of silicon oxide, silicon nitride, and silicon oxynitride.

The spacers SP may expose top surfaces of the first electrodes HE1. Variable resistance structures CR1 may be formed on respective ones of the exposed top surfaces of the electrodes HE1. The variable resistance structures CR1 may directly contact the first electrodes HE1. The variable resistance structures CR1 may not entirely fill the hole regions 193. As an example, the variable resistance structures CR1 may be formed by forming a variable resistance layer entirely filling the hole regions 193 and then etching-back the variable resistance layer.

In embodiments where the variable resistance memory device is a phase change memory device, the variable resistance structures CR1 may include a material capable of a reversible phase change between a crystalline phase and an amorphous phase depending on temperature. The variable resistance structures CR1 may include a compound formed by combination of at least one of chalcogen elements, for example, Te and Se, and at least one of Ge, Sb, Bi, Pb, Sn, Ag, As, S, Si, In, Ti, Ga, P, O, and C. For example, the variable resistance structures CR1 may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. The variable resistance layer for forming the variable resistance structures CR1 may be formed by a physical vapor deposition (PVD) process or chemical vapor deposition (CVD) process.

Intermediate electrodes ME1 may be formed on the variable resistance structures CR1 and may fill the hole regions 193. The intermediate electrodes ME1 may physically separate the variable resistance structures CR1 from switching elements described later. The intermediate electrodes ME1 may be formed by forming a conductive material filling the hole regions 193 and then performing a planarization process on the conductive material. The intermediate electrodes ME1 may include at least one of W, Ti, Al, Cu, C, CN, TiN, TiAlN, TiSiN, TiCN, WN, CoSiN, WSiN, TaN, TaCN, and TaSiN.

Figure 9A:
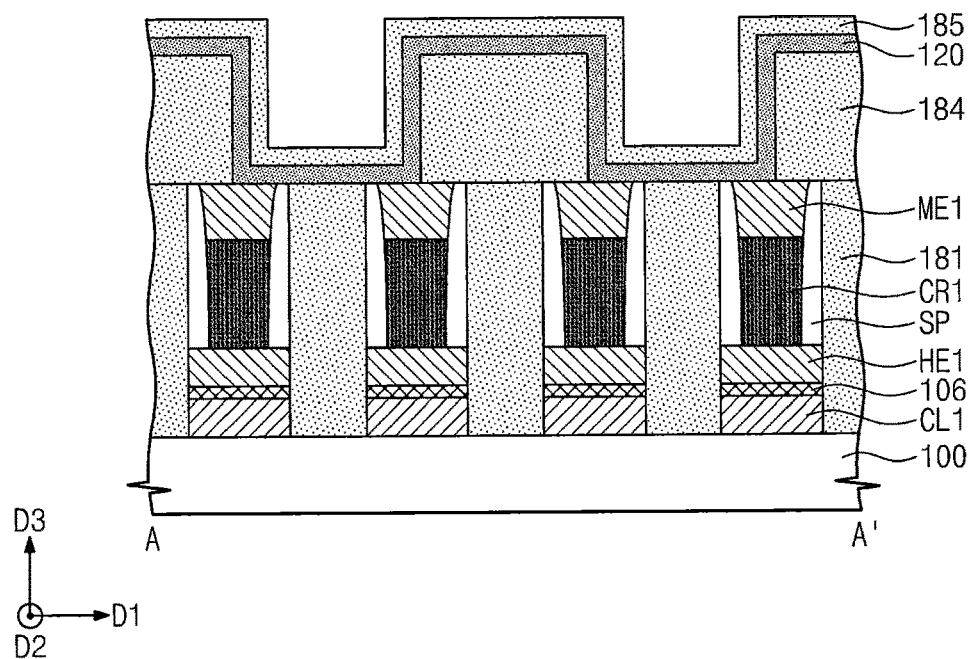
Figure 9B:
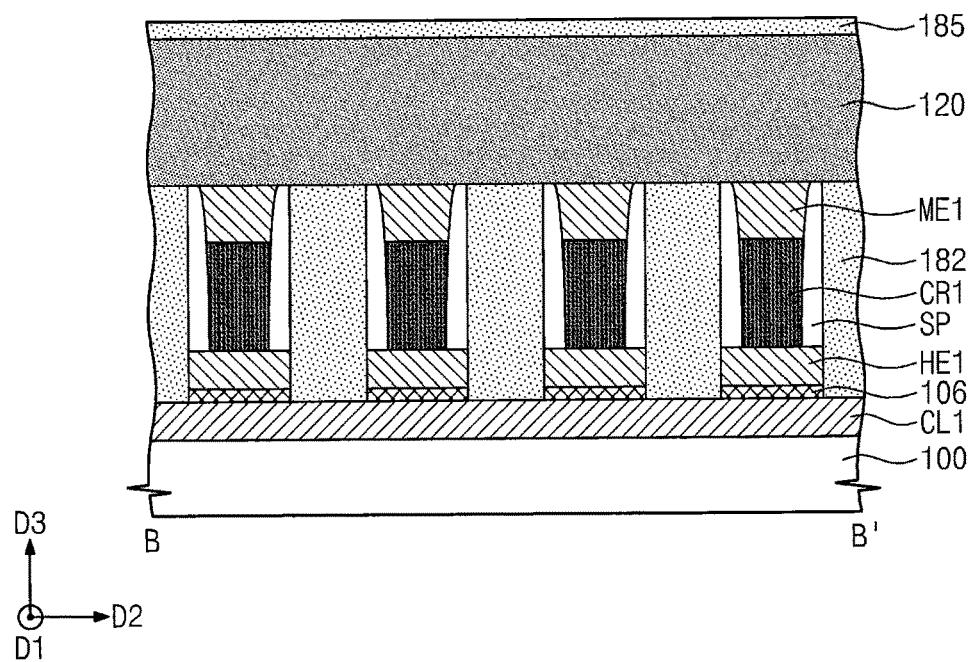

Referring to FIGS. 9A and 9B, first insulating patterns 184 may be formed on a resulting structure in which the intermediate electrodes ME1 are formed. The first insulating patterns 184 may extend in the second direction D2 and may be spaced apart from each other in the first direction D1. Alternatively, the first insulating patterns 184 may extend in the first direction D1 and may be spaced apart from each other in the second direction D2. In embodiments where the intermediate electrodes ME1 are arranged to form a plurality of rows in the second direction D2, each of the first insulating patterns 184 may be formed to vertically overlap a pair of rows of the intermediate electrodes ME1 adjacent to each of the first insulating patterns 184. Each of the first insulating patterns 184 may expose a portion of each of top surfaces of the pair of rows of the intermediate electrodes ME1, which are overlapped by each of the insulating patterns 184. The first insulating patterns 184 may include at least one of silicon oxide, silicon nitride, silicon oxynitride.

A switching layer 120 and a second insulating layer 185 may be sequentially formed on the first insulating patterns 184. The switching layer 120 and the second insulating layer 185 may be conformally formed on the exposed top surfaces of the intermediate electrodes ME1 and on the first insulating patterns 184. The second insulating layer 185 may include the same material as the first insulating patterns 184. The switching layer 120 may include a compound formed by combination of at least one of chalcogen elements, for example, Te and Se, and at least one of Ge, Sb, Bi, Al, Pb, Sn, Ag, As, S, Si, In, Ti, Ga, and P. The switching layer 120 may further include a thermal stabilization element in addition to the compound. The thermal stabilization element may include at least one of C, N, and O. In some embodiments, the switching layer 120 may be formed of the compound doped with at least one of C, N, and O. In some embodiments, the thermal stabilization element may be simultaneously deposited along with at least one of As, Ge, Se, Te, Si, Bi, S, Sb, In, P, Al, and Pb. As an example, the switching layer 120 may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Figure 10A:
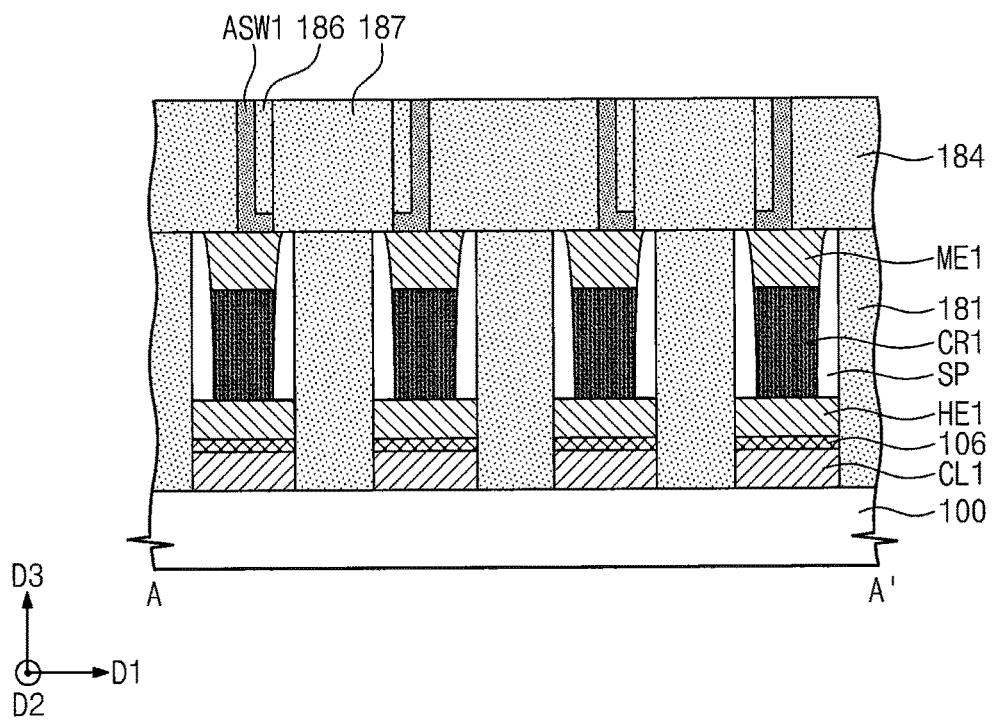
Figure 10B:
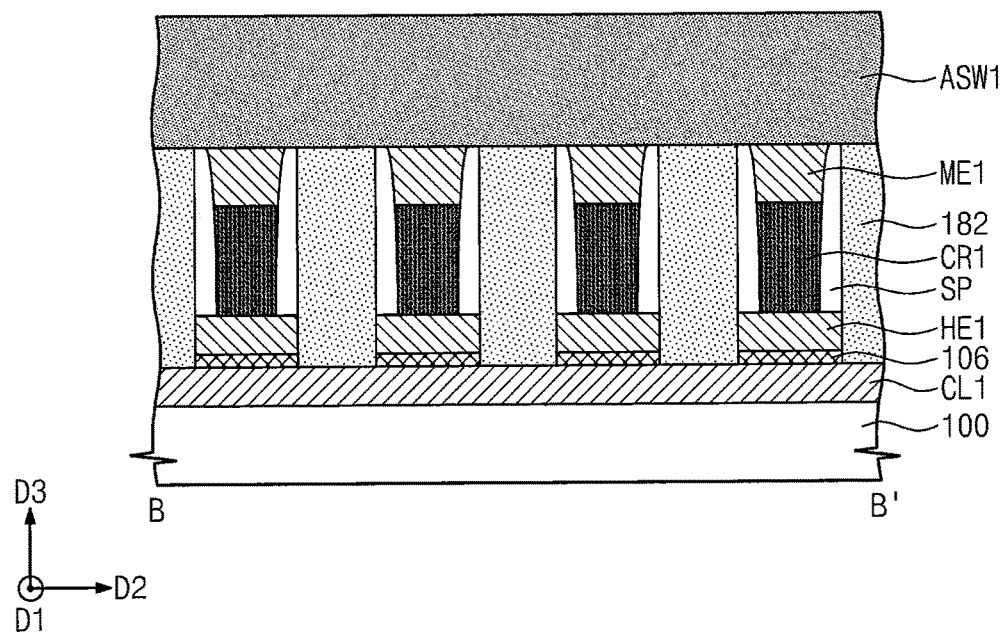

Referring to FIGS. 10A and 10B, an anisotropic etching process may be performed on the switching layer 120 to form preliminary switching elements ASW1 separated from each other. The anisotropic etching process may include a dry etching process and/or a wet etching process. The preliminary switching elements ASW1 may extend in the second direction D2, may be connected to a plurality of the intermediate electrodes ME1, and may be spaced apart from each other in the first direction D1. The second insulating layer 185 may be etched by the anisotropic etching process to form the second insulating patterns 186 which are separated from each other along with the preliminary switching elements ASW1. A portion of each of the preliminary switching elements ASW1 covered by each of the second insulating patterns 186 may not be removed, thus a lower portion of each of the preliminary switching elements ASW1 may include a portion protruding in the first direction D1 (or a portion extending laterally). Surfaces (hereinafter, to be un-etched surfaces UDS of the switching elements shown in FIGS. 5A and 5B) of each of the preliminary switching elements ASW1 covered by each of the second insulating patterns 186 may not be subject to etching damage during the anisotropic etching process. Since the surfaces of the preliminary switching elements ASW1 are covered by the second insulating patterns 186 during the anisotropic etching process, deterioration of switching characteristics of the switching elements, for example, a change in the surface composition due to etchant collision and/or a variation of a crystallization temperature and/or of a threshold voltage of the switching elements due to inflow of etchant, may be prevented or reduced. The anisotropic etching process may be performed without using a double patterning technology (DPT). Thus, it may be possible to simplify the process.

Third insulating patterns 187 may be formed to fill spaces between the first insulating patterns 184. The formation of the third insulating patterns 187 may include forming an insulating layer on a resulting structure in which the preliminary switching elements ASW1 are formed and planarizing the insulating layer to expose top surfaces of the preliminary switching elements ASW1. The third insulating patterns 187 may include at least one of silicon oxide, silicon nitride, and silicon.

Figure 11A:
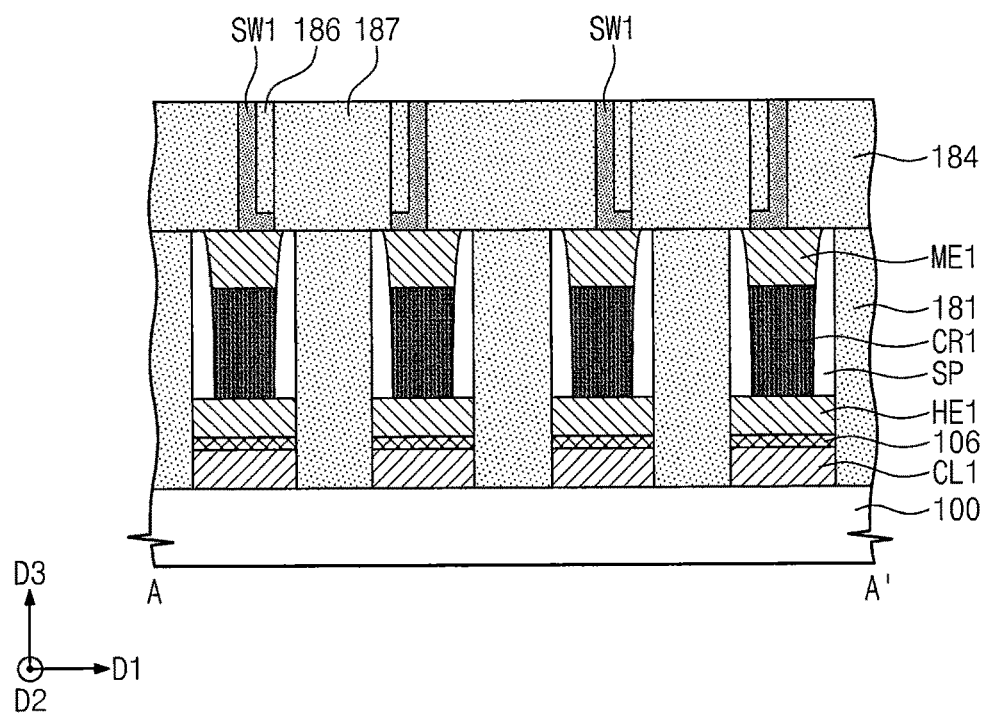
Figure 11B:
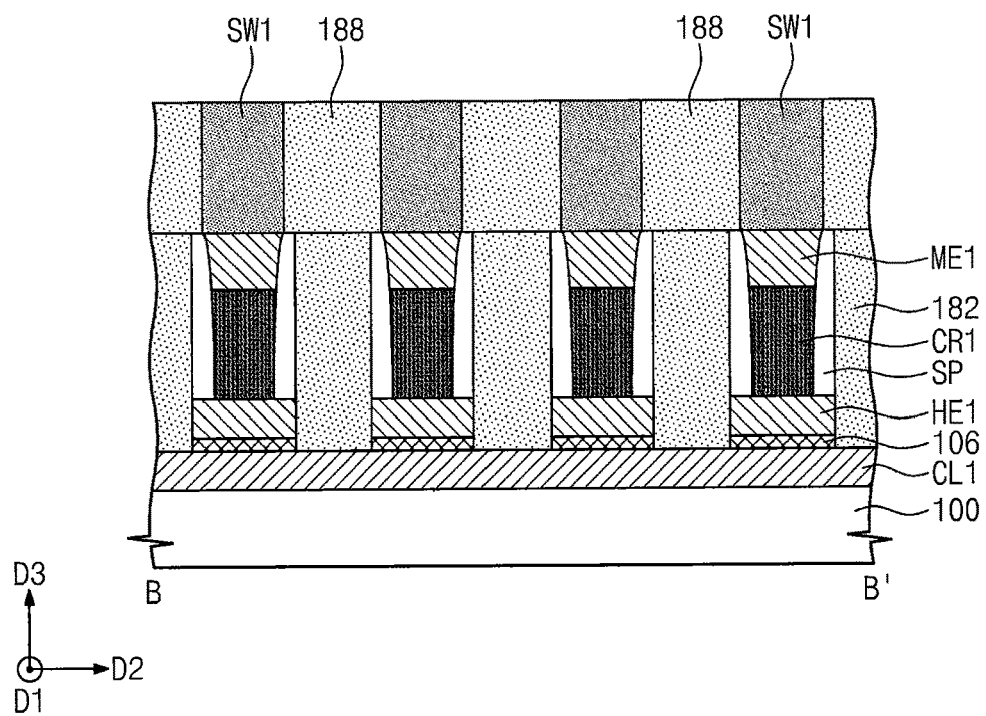

Referring to FIGS. 11A and 11B, the preliminary switching elements ASW1 may be patterned to form switching elements SW1 which are spaced apart from each other in the first and second directions D1 and D2. The switching elements SW1 may be disposed on respective intermediate electrodes ME1 to be separated apart from each other. The patterning process of the preliminary switching elements ASW1 may be performed using a double patterning technology (DPT), but is not limited thereto. The patterning process may include forming mask patterns which extend in the first direction D1 and are spaced apart from each other in the second direction D2, on the preliminary switching elements ASW1, and etching the preliminary switching elements ASW1 and the first through third insulating patterns 184, 186, and 187 using the mask patterns as an etch mask. As a result, the switching elements SW1 may be spaced apart from each other in the second direction D2 by trenches. Fourth insulating patterns 188 may be formed to fill the trenches between the switching elements SW1. The fourth insulating patterns 188 may be formed of the same material as the third insulating patterns 187.

Figure 12A:
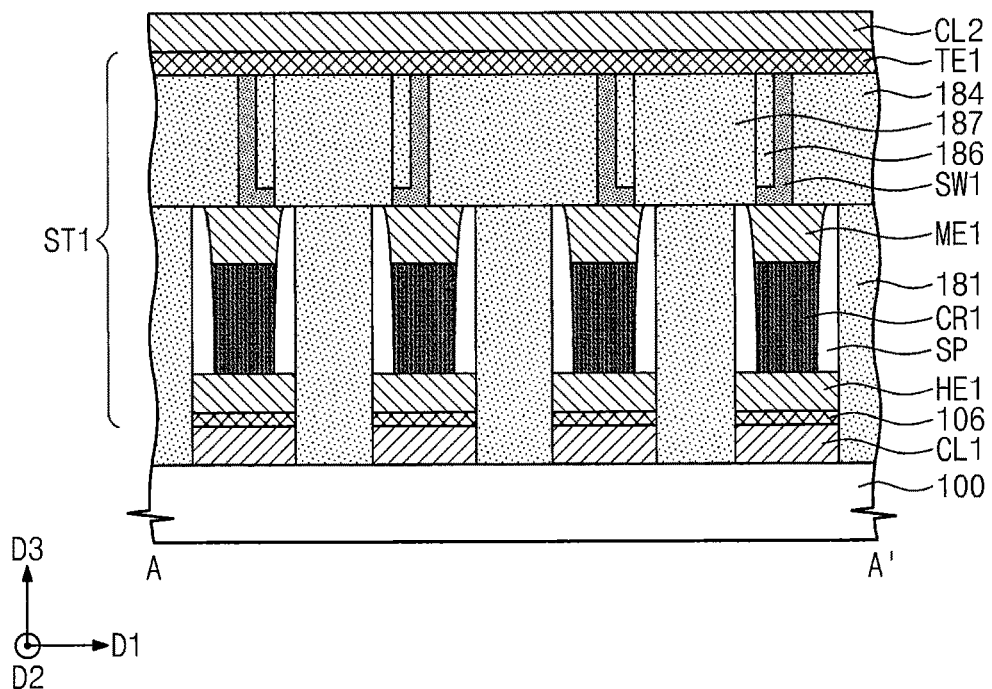
Figure 12B:
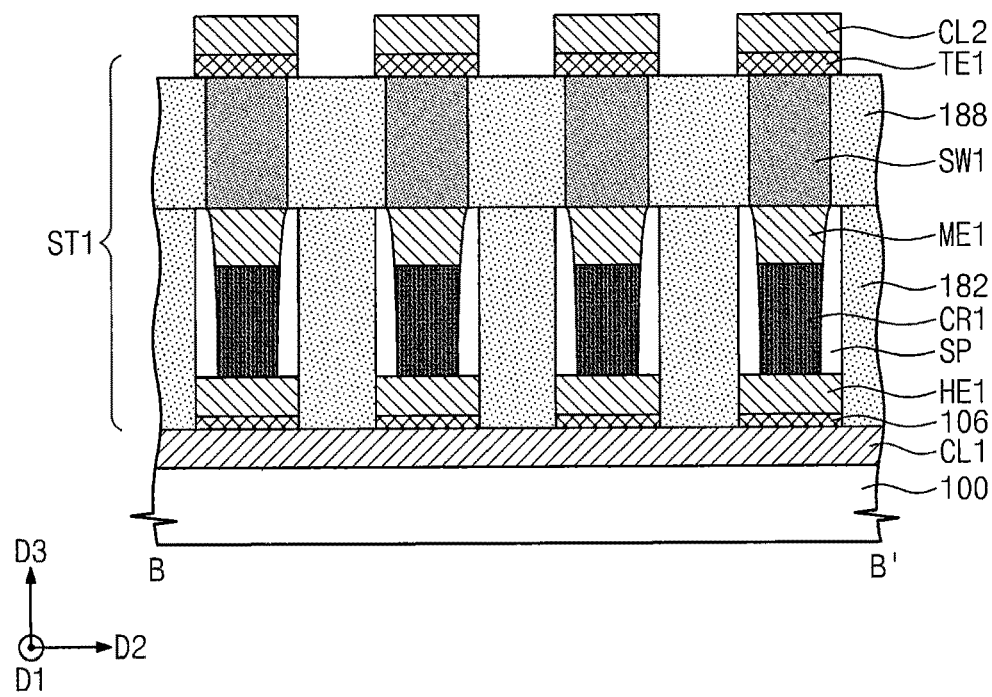

Referring to FIGS. 12A and 12B, second electrodes TE1 may be formed to extend in the first direction D1 and be spaced apart from each other in the second direction D2. The second electrodes TE1 may each be commonly connected to the switching elements SW1 arranged in the first direction D1. Alternatively, the second electrodes TE1 may be formed on respective switching elements SW1 to be spaced apart from each other, such that the second electrodes TE1 are two-dimensionally arrayed. By the formation of the second electrodes TE1, a formation of a first cell stack ST1 may be completed.

Second conductive lines CL2 may be formed on the first cell stack ST1. The second conductive lines CL2 may extend in a direction crossing the first conductive lines CL1 (or in a first direction D1). The second conductive lines CL2 may be formed of the same material as the first conductive lines CL1. The second electrodes TE1 and the second conductive lines CL2 may be formed by depositing conductive layers different from each other and then performing a single patterning process on the conductive layers. Alternatively, any one of the second electrodes TE1 and the second conductive lines CL2 may be formed using a damascene process.

Referring again to FIGS. 4A and 4B, a second cell stack ST2 may be formed on the second conductive lines CL2. The second cell stack ST2 may be formed by using substantially the same processes as used for forming the first cell stack ST1. For example, the second cell stack ST2 may include barrier patterns 108, first electrodes HE2, variable resistance structures CR2, intermediate electrodes ME2, switching elements SW2, and second electrodes TE2 which are sequentially formed on the second conductive lines CL2. The barrier patterns 108, the first electrodes HE2, the variable resistance structures CR2, the intermediate electrodes ME2, the switching elements SW2, and second electrodes TE2 of the second cells stack ST2 may be respectively formed by using substantially the same processes as used for forming the barrier patterns 106, the first electrodes HE1, the variable resistance structures CR1, the intermediate electrodes ME1, the switching elements SW1, and second electrodes TE1 of the first cells stack ST1. However, the second electrodes TE2 of the second cell stack ST2 may be formed to extend in a direction crossing an extension direction of the second electrodes TE1 of the first cell stack ST1 (or in the second direction D2). Alternatively, the second electrodes TE2 of the second cell stack ST2 may be formed on respective switching elements SW2 of the second cell stack ST2 to be spaced apart from each other, such that the second electrodes TE2 of the second cell stack ST2 are two-dimensionally arrayed.

In some embodiments, a configuration of an A-A' cross-section of the second cell stack ST2 may be formed to be similar to that of a B-B' cross-section of the first cell stack ST1. A configuration of a cross-section of the second cell stack ST2 of FIG. 4A and a configuration of a cross-section of the second cell stack ST2 of FIG. 4B may be reversed with respect to each other. Such structure may be achieved by changing a patterning direction for forming the second cell stack ST2 into a direction crossing or perpendicular to a patterning direction for forming the first cell stack ST1.

Third conductive lines CL3 may be formed on the second cell stack ST2. The third conductive lines CL3 may extend in a direction parallel to the extension direction of the first conductive lines CL1 (or in the second direction D2) and may be spaced apart from each other in a direction crossing the extension direction of the first conductive lines CL1 (or in the first direction D1). Third conductive lines CL3 may be vertically spaced apart from the second conductive lines CL2. The third conductive lines CL3 may be formed of the same material as the first and second conductive lines CL1 and CL2. The third conductive lines CL3 may be formed by a patterning process along with the second electrodes TE2 or by a separate damascene process.

In embodiments where the variable resistance memory according to example embodiments of present inventive concepts includes three or more cell stacks, the processes for forming first and second cell stacks ST1 and ST2 may further be repeatedly performed.

The switching elements formed by the processing methods described with reference FIGS. 6A through 12A and FIGS. 6B through 12B may have a shape which is similar to or the same as that shown in FIG. 5A. The switching elements having a shape shown in FIG. 5B may be manufactured by changing a shape of the first insulating patterns 184 of FIG. 9A in the processing methods described with reference to FIGS. 6A through 12A and FIGS. 6B through 12B. In other words, the first insulating patterns 184 of FIG. 9A may include a plurality of cylindrical holes spaced apart from each other in the first and second directions D1 and D2, and the switching elements formed based on the cylindrical holes may have a shape similar to that shown in FIG. 5B.

According to example embodiments of present inventive concepts, etching damage of the switching elements may be prevented or reduced, and thus electrical properties of the variable resistance memory device may be improved. In addition, it may be possible to simplify the process of forming the switching elements.

Figure 13:
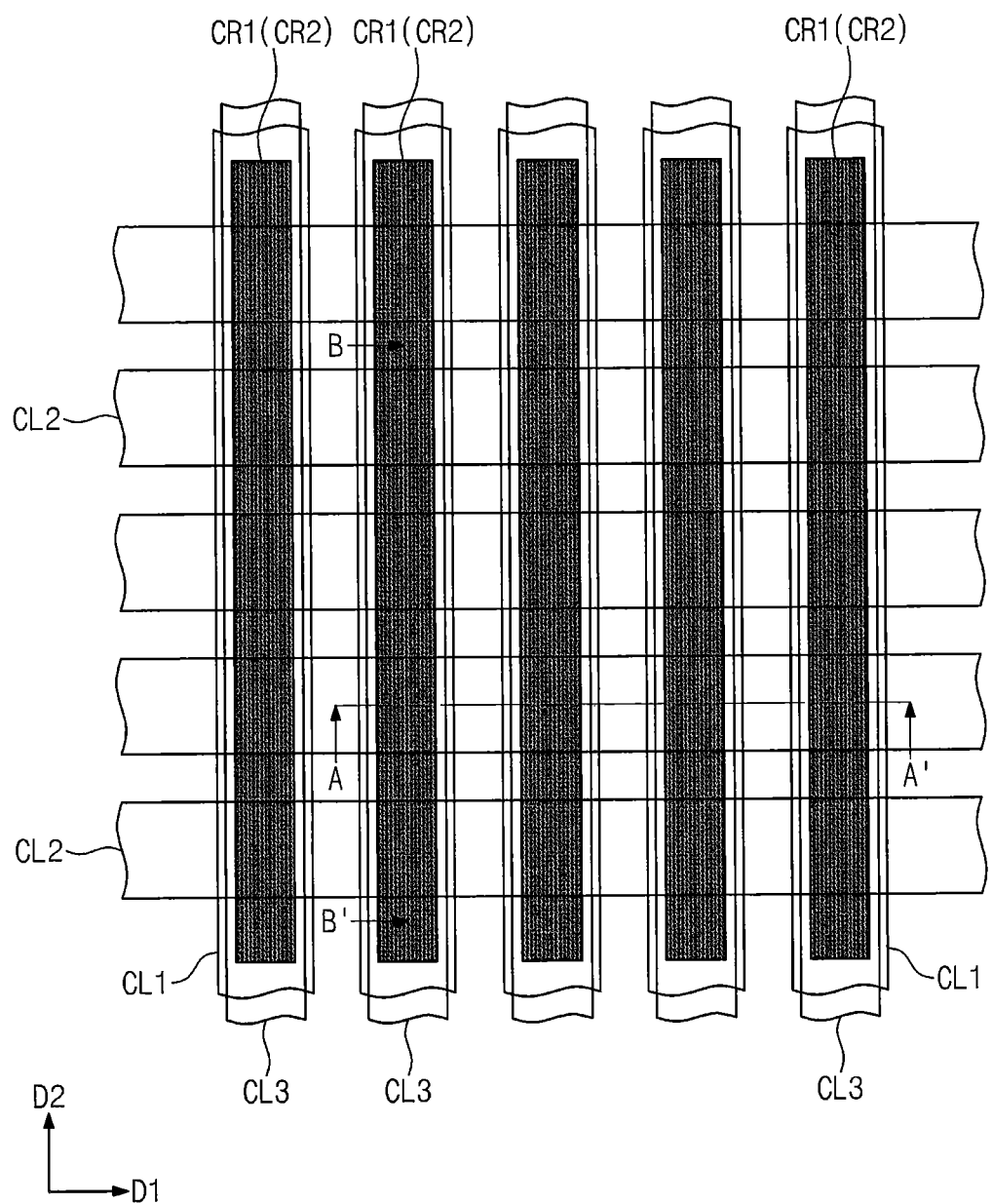
FIG. 13 is a plan view illustrating a variable resistance memory device according to example embodiments of present inventive concepts.
Figure 14A:
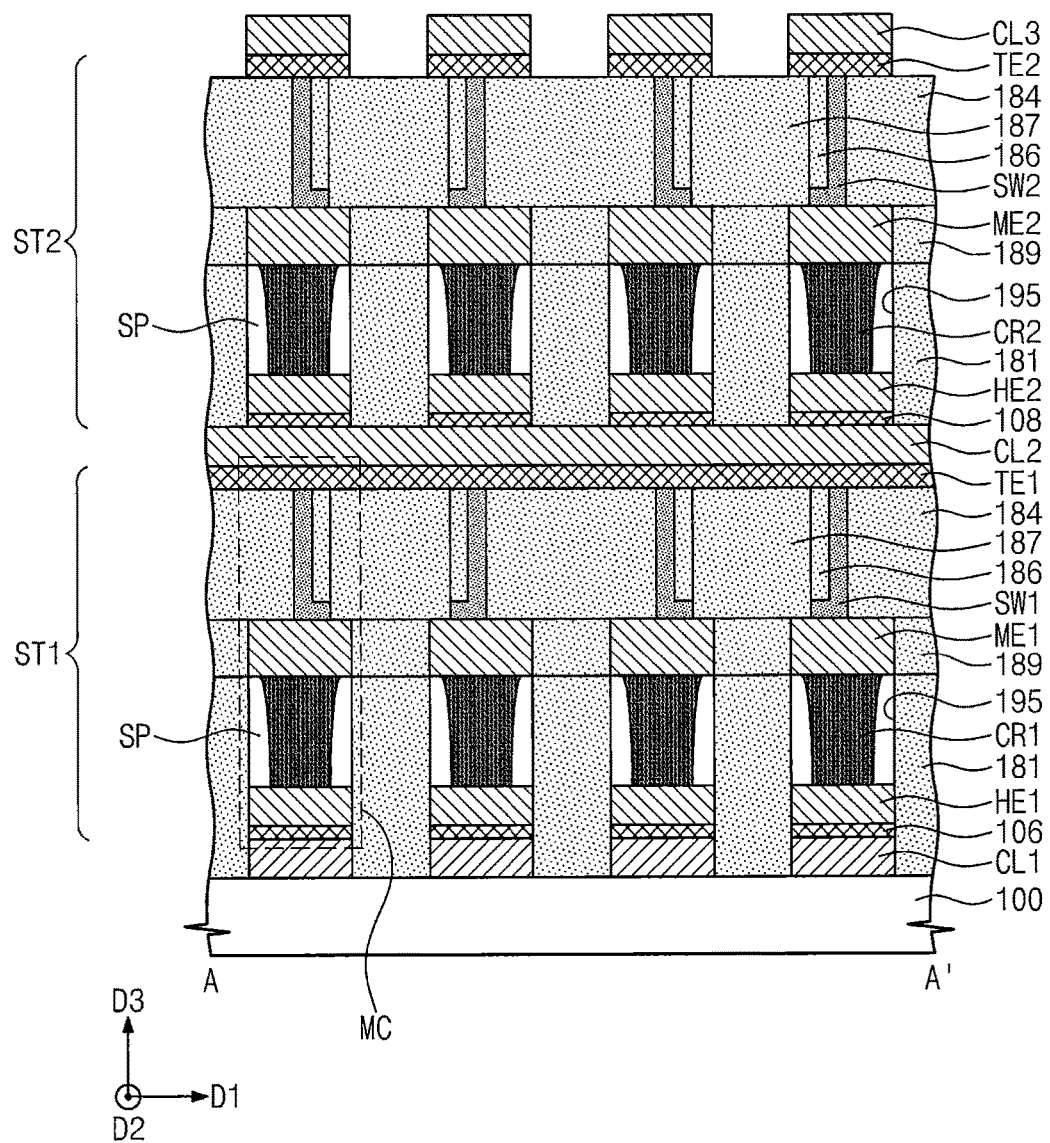
FIG. 14A is a cross-sectional view taken along line A-A' of FIG. 13.
Figure 14B:
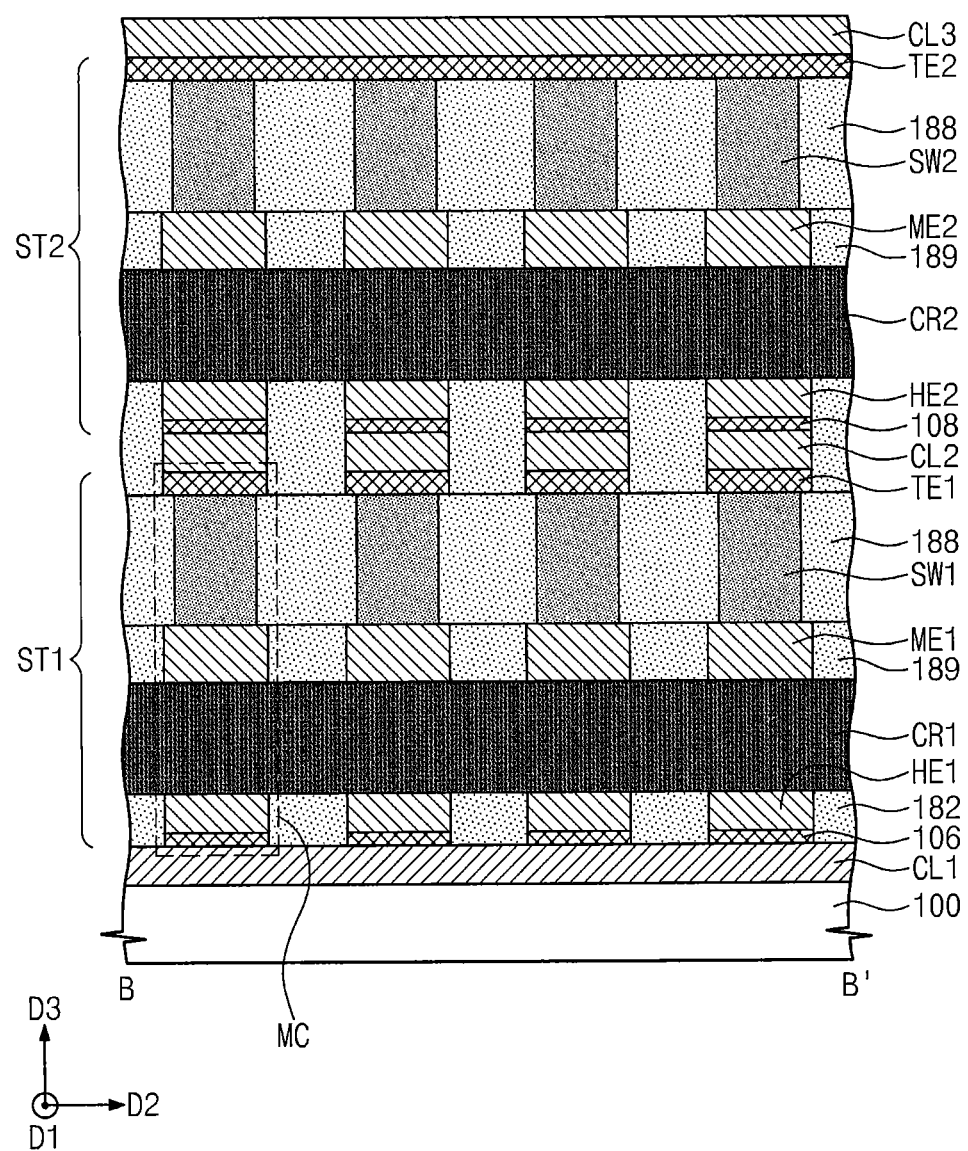
FIG. 14B is a cross-sectional view taken along line B-B' of FIG. 13.

FIG. 13 is a plan view illustrating a variable resistance memory device according to example embodiments of present inventive concepts. FIG. 14A is a cross-sectional view taken along line A-A' of FIG. 13, and FIG. 14B is a cross-sectional view taken along line B-B' of FIG. 13. For the sake of brevity, duplicate descriptions of previously-illustrated features/elements herein may be briefly given or omitted.

Referring to FIGS. 13, 14A and 14B, a first cell stack ST1 and a second cell stack ST2 may be sequentially provided on a substrate 100. The first and second cell stacks ST1 and ST2 may correspond to the memory cell stacks MCA described with reference to FIGS. 1 and 2. The first cell stack ST1 may be disposed between first conductive lines CL1 and second conductive lines CL2 which are sequentially provided to be vertically spaced apart from each other. The first cell stack ST1 may include memory cells MC which are disposed at respective intersections of the first conductive lines CL1 and the second conductive lines CL2. The memory cells MC may each include a variable resistance structure CR1 and a switching element SW1. The memory cells MC may each include an intermediate electrode ME1 between the variable resistance structure CR1 and the switching element SW1.

The variable resistance structures CR1 may be provided in trench regions 195 formed in first and second interlayer insulating layers 181 and 182 on the substrate 100. In plan view, the trench regions 195 may have a linear shape which extends in the second direction D2 and may be spaced apart from each other. Thus, the variable resistance structures CR1 provided in respective trench regions 195 may also extend in the second direction D2 to have a linear shape and may be spaced apart from each other in the first direction D1. The variable resistance structures CR1 may each be shared by a plurality of the memory cells MC. In other words, the single variable resistance structure CR1 may constitute a portion of each of a plurality of the memory cells MC. Spacers SP may be disposed between sidewalls of the trench regions 195 and variable resistance structures CR1. The variable resistance structures CR1 may include at least one of materials capable of storing information.

First electrodes HE1 may be disposed between the first conductive lines CL1 and the variable resistance structures CR1. In plan view, the first electrodes HE1 may be disposed at respective intersections of the first and second conductive lines CL1 and CL2 and may be arrayed in two-dimensional arrangements. Barrier patterns 106 may be disposed between the first electrodes HE1 and the first conductive lines CL1. The barrier patterns 106 may each be disposed under each of the first electrodes HE1. In some embodiments, the barrier patterns 106 may extend along an extension direction of the first conductive lines CL1. In some embodiments, the barrier patterns 106 may be omitted.

Intermediate electrodes ME1 may be formed on the variable resistance structures CR1 to contact top surfaces of the variable resistance structures CR1. In plan view, the intermediate electrodes HE1 may be disposed at respective intersections of the first and second conductive lines CL1 and CL2 and may be arrayed in two-dimensional arrangements. Accordingly, the variable resistance structures CR1 may be connected in common to a plurality of the intermediate electrodes ME1 arranged in second direction D2.

The intermediate electrodes ME1 may not be disposed in the trench regions 195. The trench regions 195 may be filled with the spacers SP and the variable resistance structures CR1, and the intermediate electrodes ME1 may be formed in a third insulating layer 189 formed on the variable resistance structure CR1. For example, after contact holes exposing the top surfaces of the variable resistance structures CR1 are formed in the third interlayer insulating layer 189, a damascene process may be performed to form the intermediate electrodes ME1.

The switching elements SW1 may be disposed in insulating patterns on the third interlayer insulating layer 189. The insulating patterns may include first through fourth insulating patterns 184, 186, 187, and 188. A lower portion of each of the switching elements SW1 may be connected to each of the intermediate electrodes ME1, and an upper portion of each of the switching elements SW1 may be connected to each of second electrodes described later, but such portions are not limited thereto.

The second electrodes TE1 may be disposed between the switching elements SW1 and the second conductive lines CL2. The second electrodes TE1 may extend in the first direction D1 and may be spaced apart from each other in the second direction D2. The second electrodes TE1 may be commonly connected to a plurality of the switching elements SW1 arranged in the first direction D1. In some embodiments, the second electrodes TE1 may be disposed on respective switching elements SW1 to be spaced apart from each other, such that the second electrodes TE1 are arrayed in two-dimensions.

The second cell stack ST2 may be substantially the same structure as the first cell stack ST1. For example, the second cell stack ST2 may include barrier patterns 108, first electrodes HE2, variable resistance structures CR2, intermediate electrodes ME2, switching elements SW2, and second electrodes TE2 which are sequentially formed on the second conductive lines CL2. In some embodiments, an A-A' cross-section of the second cell stack ST2 may be formed to have a shape (or configuration) similar to that of a B-B' cross-section of the first cell stack ST1. For example, a shape (or configuration) of a cross-section of the second cell stack ST2 of FIG. 4A and a shape (or configuration) of a cross-section of the second cell stack ST2 of FIG. 4B may be reversed with respect to each other. Third conductive lines CL3 may be provided on the second cell stack ST2. The third conductive lines CL3 may extend in a direction parallel to the extension direction of the first conductive lines CL1 (or in the second direction D2) and may be spaced apart from each other in a direction parallel to the extension direction of the second conductive lines CL2 (or in the first direction D1). Third conductive lines CL3 may be vertically spaced apart from the second conductive lines CL2.

Figure 15A:
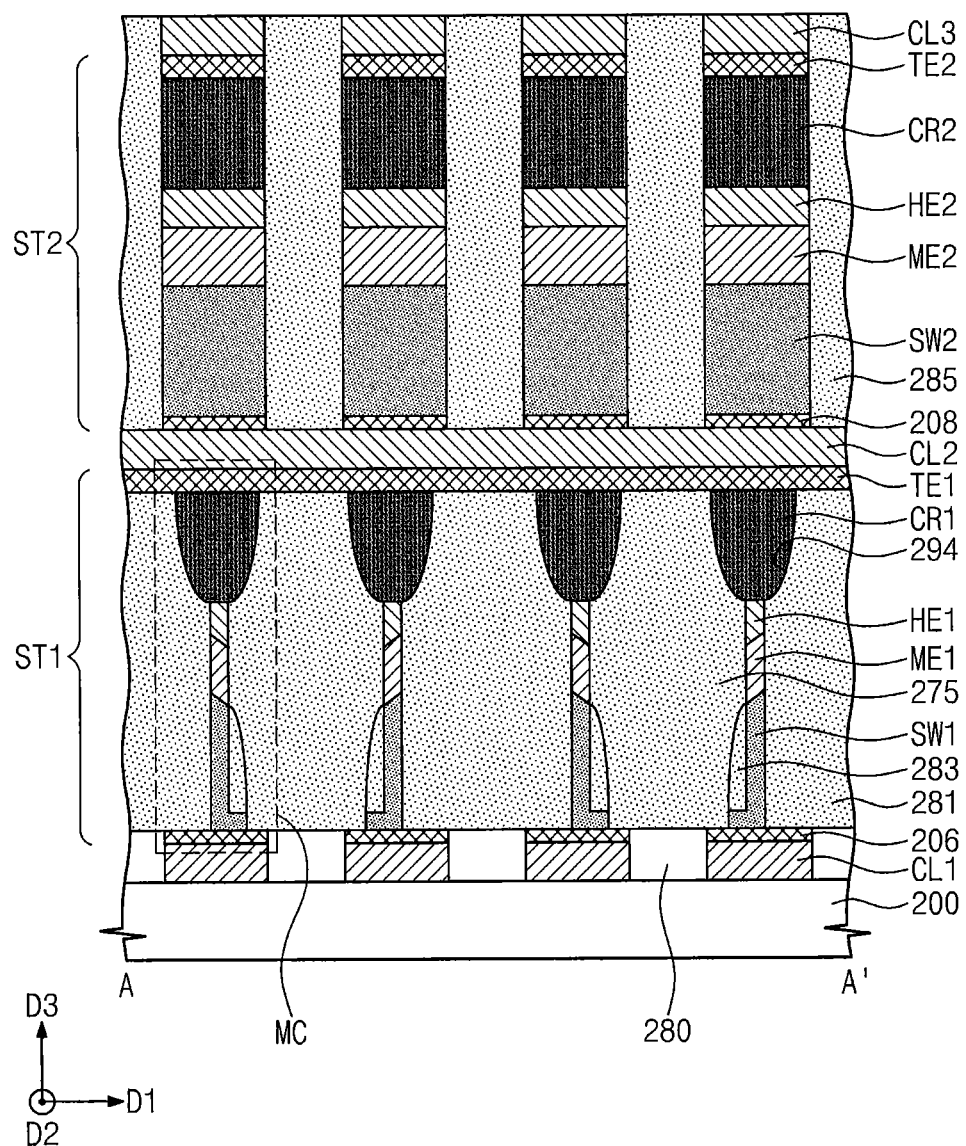
FIGS. 15A and 15B illustrate a variable resistance memory device according to example embodiments of present inventive concepts and are cross-sectional views taken along lines A-A' and B-B' of FIG. 3, respectively.
Figure 15B:
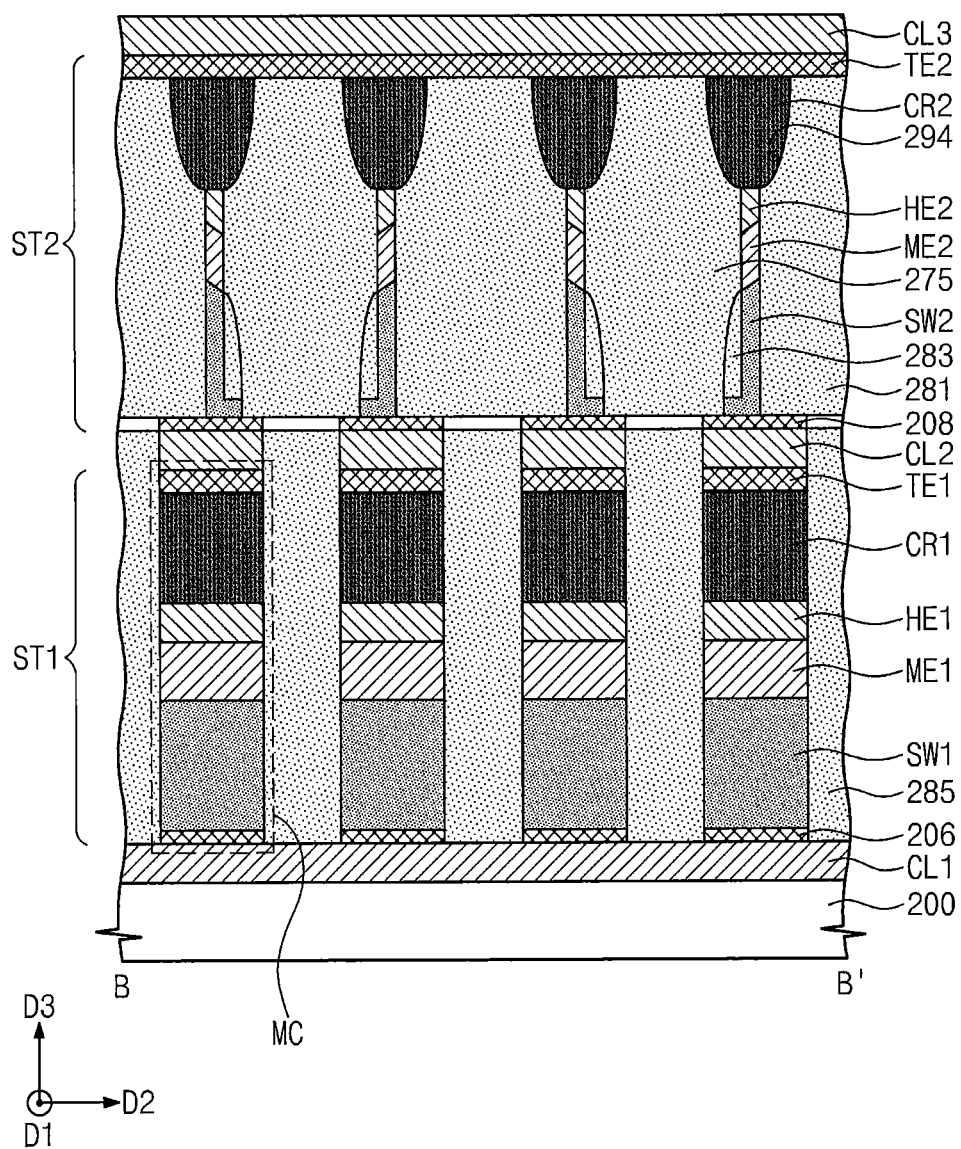

FIGS. 15A and 15B illustrate a variable resistance memory device according to example embodiments of present inventive concepts, and are cross-sectional views taken along lines A-A' and B-B' of FIG. 3, respectively. For the sake of brevity, duplicate descriptions of previously-illustrated features/elements herein may be briefly given or omitted.

Referring to FIGS. 3, 15A, and 15B, a first cell stack ST1 and a second cell stack ST2 may be sequentially disposed on a substrate 200 in a direction vertical to a top surface of the substrate 200. For convenience, two cell stacks are illustrated. However, three or more cell stacks may be provided on the substrate 200. In this case, structures corresponding to the first cell stack ST1 and the second cell stack ST2 may be repeatedly and alternately stacked on each other.

The first cell stack ST1 may be disposed between first conductive lines CL1 and the second conductive lines CL2 which are sequentially provided on the substrate 200 to be vertically spaced apart from each other. The first conductive lines CL1 may extend in a first direction D1 parallel to the top surface of the substrate 200, and the second conductive lines CL2 may extend in a second direction D2 crossing the first direction D1 and parallel to the top surface of the substrate 200. The first conductive lines CL1 may be provided in a first interlayer insulating layer 280. The first interlayer insulating layer 280 may include at least one of silicon oxide, silicon nitride, and silicon oxynitride, for example.

The first cell stack ST1 may include memory cells MC which are disposed at respective intersections of the first conductive lines CL1 and the second conductive lines CL2. The memory cells MC may be provided in insulating patterns 281, 283, 285, and 275. The memory cells MC may each include a variable resistance structure CR1 and a switching element SW1. The memory cells MC may each include an intermediate electrode ME1 between the variable resistance structure CR1 and the switching element SW1. Second electrodes TE1 may be disposed between the variable resistance structure CR1 and the second conductive lines CL2.

The memory cells MC may include barrier patterns 206. The barrier patterns 206 may be disposed between the switching elements SW1 and the first conductive lines CL1. The barrier patterns 206 may include at least one of W, Ti, Al, Cu, C, CN, TiN, TiAlN, TiSiN, TiCN, WN, CoSiN, WSiN, TaN, TaCN, and TaSiN. The barrier patterns 206 may be disposed under respective switching elements SW1 and may be spaced apart from each other.

The switching elements SW1 may be disposed between the variable resistance structures CR1 and the substrate 200. First electrodes HE1 may be disposed between the intermediate electrodes ME1 and the variable resistance structures CR1. A sidewall of each of the switching elements CR1, a sidewall of each of the intermediate electrodes ME1, and a sidewall of each of the first electrodes HE1 may be vertically aligned with each other. The sidewall of each of the switching elements SW1, the sidewall of each of the intermediate electrodes ME1, and the sidewall of each of the first electrodes HE1 may be aligned with each other in a cross-section according to a plane defined by the first direction D1 and the third direction D3 as shown in the first cell stack ST1 of FIG. 15A and may be aligned with each other in a cross-section according to a plane defined by the second direction D2 and the third direction D3 as shown in the first cell stack ST1 of FIG. 15B. A sidewall of each of the variable resistance structures CR1 may be connected to the sidewall of each of the first electrodes HE1 thereunder in the cross-section according to the plane defined by the first direction D1 and the third direction D3. The sidewall of each of the variable resistance structures CR1 may be vertically aligned with the sidewall of each of the switching elements SW1, the sidewall of each of the intermediate electrodes ME1, and the sidewall of each of the first electrodes HE1 thereunder in the cross-section according to the plane defined by the second direction D2 and the third direction D3.

The switching elements SW1 may each have a bottom surface being in contact with a top surface of each of the barrier patterns 206. The switching elements SW1 may each have the first portion P1 and the second portion P2 as described with reference to FIGS. 5A and 5B. The switching elements SW1 may each include an etched surface formed by etching and un-etched surfaces UDS formed without etching. The top surfaces of the first portions P1 of the switching elements SW1 connected to the intermediate electrodes ME1 may not be parallel to the top surface of the substrate 200 and may be sloped relative to the top surface of the substrate 200. Second insulating patterns 283 may each be provided to cover a top surface of the second portion P2 of each of the switching elements SW1 and a sidewall of the first portion P1 of each of the switching elements SW1. The second insulating patterns 283 may each be disposed to form a spacer pattern on the sidewall of the second portion P2 of each of the switching elements SW1. The second insulating patterns 283 may be disposed on opposing/facing sidewalls of a pair of the mirror-symmetrical switching elements SW1 and may be spaced apart from each other. The second insulating patterns 283 may include at least one of silicon oxide, silicon nitride, and silicon oxynitride.

The switching elements SW1 may be ovonic threshold switch (OTS) elements that have a bidirectional property. For example, the switching elements SW1 may be elements based on a threshold switching phenomenon having a non-linear (e.g., S-shaped) I-V curve. The switching elements SW1 may have a phase change temperature between a crystalline phase and an amorphous phase greater than that of the variable resistance elements CR1.

The intermediate electrodes ME1 may include at least one of W, Ti, Al, Cu, C, CN, TiN, TiAlN, TiSiN, TiCN, WN CoSiN, WSiN, TaN, TaCN, and TaSiN. The first electrodes HE1 may function as heater electrodes heating the variable resistance structures CR1 to change the phases of the variable resistance structures CR1. The first electrodes HE1 may be formed of a material whose resistivity is greater than that of the first conductive lines CL1. The first electrodes HE1 may include at least one of W, Ti, Al, Cu, C, CN, TiN, TiAlN, TiSiN, TiCN, WN, CoSiN, WSiN, TaN, TaCN, TaSiN, and TiO. Bottom surfaces of the intermediate electrodes ME1 and the first electrodes HE1 may not be parallel to the top surface of the substrate 200 and may be sloped relative to the top surface of the substrate 200.

The variable resistance structures CR1 may fill recess regions 294 formed in upper portions of the first and third insulating patterns 281 and 275. A width of each of the variable resistance elements CR1 may be greater than that of each of the intermediate electrodes ME1 and the first electrodes HE1, in the first direction D1. In the first direction D1 (or in a cross-section in the first direction D1), a top surface of each of the variable resistance elements CR1 may be substantially flat and the sidewall and a bottom surface of each of the variable resistance elements CR1 may have a curved profile such as a parabola. The variable resistance elements CR1 may each have an upwardly increasing width. The variable resistance structures CR1 may include at least one of materials capable of storing information.

The second electrodes TE1 may each be commonly connected to a plurality of the variable resistance structures CR1 arranged in the first direction D1. In some embodiments, the second electrodes TE1 may be disposed on respective variable resistance structures CR1 to be spaced apart from each other, such that the second electrodes TE1 are arrayed in two-dimensions. In some embodiments, the second electrodes TE1 may be omitted.

The second cell stack ST2 may be substantially the same structure as the first cell stack ST1. For example, the second cell stack ST2 may include barrier patterns 208, switching elements SW2, intermediate electrodes ME2, first electrodes HE2, variable resistance structures CR2, and second electrodes TE2 which are sequentially formed on the second conductive lines CL2. The barrier patterns 208, the switching elements SW2, the intermediate electrodes ME2, the first electrodes HE2, the variable resistance structures CR2, and the second electrodes TE2 of the second cell stack ST2 may be respectively formed by using substantially the same processes as used for forming the barrier patterns 206, the switching elements SW1, the intermediate electrodes ME1, the first electrodes HE1, the variable resistance structures CR1, and the second electrodes TE1 of the first cells stack ST1. However, the second cell stack ST2 may have a structure in which the first cell stack ST1 is rotated by about 90 degrees relative to a central axis parallel to the third direction D3 in a plan view. A configuration of an A-A' cross-section of the second cell stack ST2 may correspond to that of a B-B' cross-section of the first cell stack ST1, and a configuration of a B-B' cross-section of the second cell stack ST2 may correspond to that of an A-A' cross-section of the first cell stack ST1. In the first portion P1 and the second portion P2 as described with reference to FIGS. 5A and 5B, the second portion P2 in the first cell stack ST1 may extend in the first direction D1 and the second portion P2 in the second cell stack ST2 may extend in the second direction D2.

Third conductive lines CL3 may be provided on the second cell stack ST2. The third conductive lines CL3 may extend in a direction parallel to the extension direction of the first conductive lines CL1 (or in the second direction D2) and may be spaced apart from each other in a direction parallel to the extension direction of the second conductive lines CL2 (or in the first direction D1). The third conductive lines CL3 may be vertically spaced apart from the second conductive lines CL2.

FIGS. 16A, 17A, 18A, 19A, 20A, and 21A illustrate a method of manufacturing a variable resistance memory device according to example embodiments of present inventive concepts and are cross-sectional views taken along line A-A' of FIG. 3, respectively. FIGS. 16B, 17B, 18B, 19B, 20B, and 21B illustrate a method of manufacturing a variable resistance memory device according to example embodiments of present inventive concepts and are cross-sectional views taken along line B-B' of FIG. 3, respectively. For the sake of brevity, duplicate descriptions of previously-illustrated features/elements herein may be briefly given or omitted.

Figure 16A:
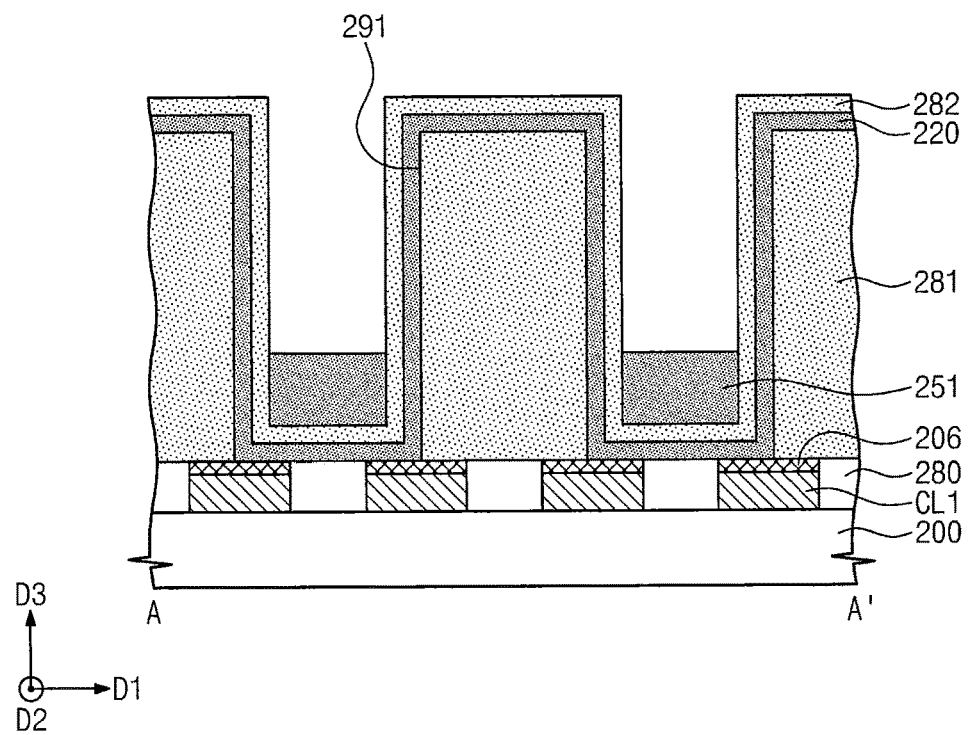
FIGS. 16A, 17A, 18A, 19A, 20A, and 21A illustrate a method of manufacturing a variable resistance memory device according to example embodiments of present inventive concepts and are cross-sectional views taken along line A-A' of FIG. 3, respectively.
Figure 16B:
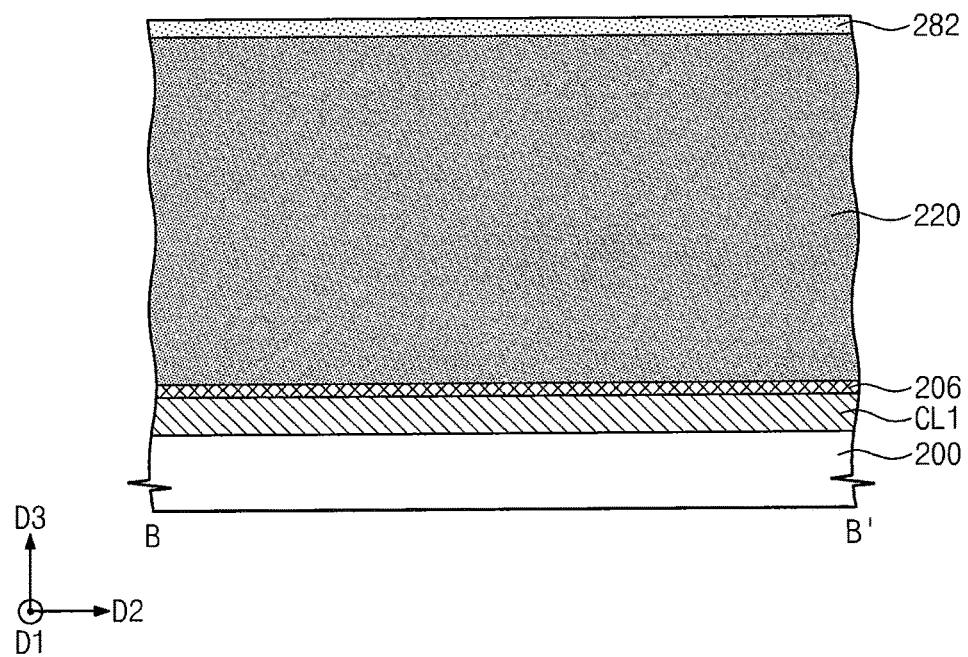
FIGS. 16B, 17B, 18B, 19B, 20B, and 21B illustrate a method of manufacturing a variable resistance memory device according to example embodiments of present inventive concepts and are cross-sectional views taken along line B-B' of FIG. 3, respectively.

Referring to FIGS. 3, 16A, and 16B, first conductive lines CL1 and barrier patterns 206 may be sequentially formed on a substrate 200. The first conductive lines CL1 and the barrier patterns 206 may be respectively spaced apart from each other in the first direction D1 and may extend in the second direction D2. The first conductive lines CL1 and the barrier patterns 206 may be formed in a first interlayer insulating layer 280. For example, the first conductive lines CL1 and the barrier patterns 206 may be formed by sequentially depositing a plurality of conductive layers on the substrate 200 and patterning the plurality of conductive layers. The first interlayer insulating layer 280 may be formed to cover sidewalls of the first conductive lines CL1 and the barrier patterns 206 and to expose top surfaces of the first conductive lines CL1 and the barrier patterns 206. In some embodiments, at least ones of the conductive lines CL1 and the barrier layer patterns 206 may be formed by performing a damascene process. The first conductive lines CL1 may include a metal having a high conductivity, for example, copper (Cu) or aluminum (Al). The barrier patterns 206 may include at least one of W, Ti, Al, Cu, C, CN, TiN, TiAlN, TiSiN, TiCN, WN, CoSiN, WSiN, TaN, TaCN, and TaSiN.

First insulating patterns 281 may be formed on the barrier patterns 206. The first insulating patterns 281 may extend in the second direction D2 and may be spaced apart from each other with respective first trenches 291 therebetween in the first direction D1. The first insulating patterns 281 may be formed to overlap vertically a pair of the adjacent barrier patterns 206. The first insulating patterns 281 may each expose a portion of a top surface of each of the pair of the adjacent barrier patterns 206 overlapped therewith. The first insulating patterns 281 may include at least one of silicon oxide, silicon nitride, and silicon oxynitride.

A switching layer 220 and a second insulating layer 282 may be sequentially formed on the first insulating patterns 281. The switching layer 220 and the second insulating layer 282 may be conformally formed on the first insulating patterns 281 and on the exposed top surfaces of the barrier patterns 206. The second insulating layer 282 may include the same material as the first insulating patterns 281. The switching layer 220 may have a phase change temperature between a crystalline phase and an amorphous phase greater than that of variable resistance structures described herein.

The switching layer 220 may include a compound formed by combination of at least one of chalcogen elements, for example, Te and Se, and at least one of Ge, Sb, Bi, Al, Pb, Sn, Ag, As, S, Si, In, Ti, Ga, and P. The switching layer 220 may further include a thermal stabilization element in addition to the compound. The thermal stabilization element may include at least one of C, N, and O. In some embodiments, the switching layer 220 may be formed of the compound doped with at least one of C, N, and O. In some embodiments, the thermal stabilization element may be simultaneously deposited along with at least one of As, Ge, Se, Te, Si, Bi, S, Sb, In, P, Al, and Pb. As an example, the switching layer 220 may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Blocking patterns 251 may be formed in respective lower portions of the first trenches 291 formed in the second insulating layer 282. The blocking patterns 251 may extend in the second direction D2 along the trenches 291. The blocking patterns 251 may expose at least a portion of the second insulating layer 282 formed on sidewalls of the first trenches 291. The blocking patterns 251 may be formed of a material of high fluidity such as a spin on hard mask (SOH). The blocking material 251 may be formed by filling the first trenches 291 with the material of high fluidity and etching-back the material.

Figure 17A:
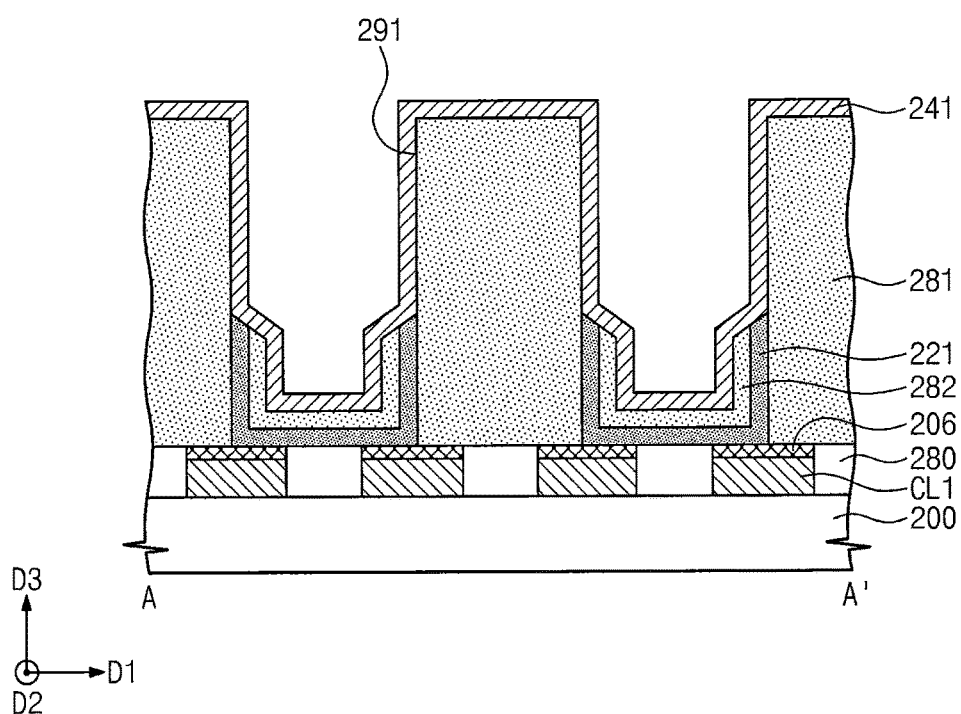
Figure 17B:
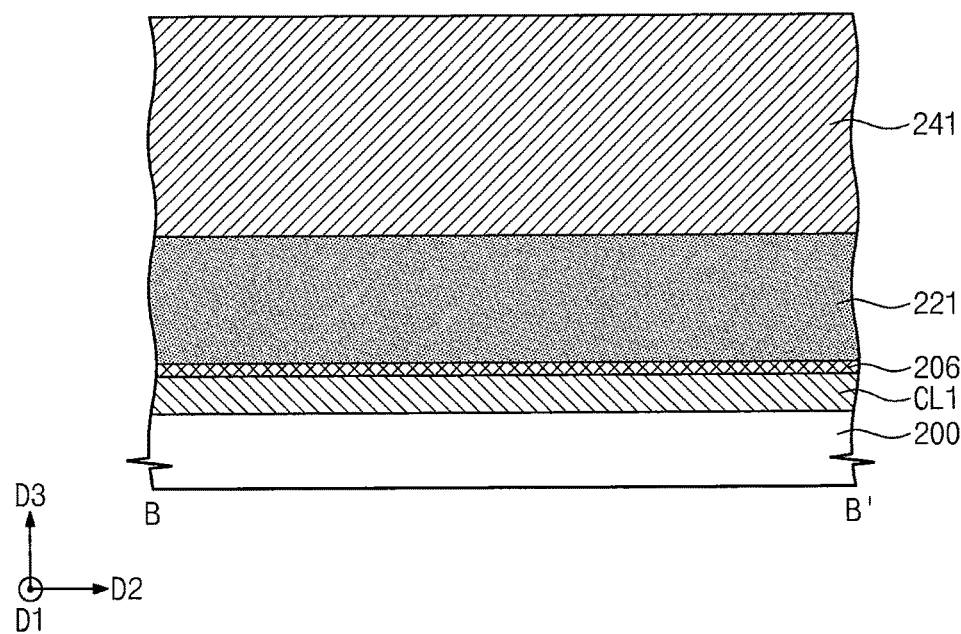

Referring to FIGS. 3, 17A, and 17B, upper portions of the switching layer 220 and the second insulating layer 282, which are not covered by the blocking patterns 251, may be etched. As a result, switching patterns 221 having a U-shaped cross-section may be formed. Top surfaces of the switching patterns 221 may have a slope as illustrated, but are not limited thereto. In addition, the second insulating layer 282 may have a U-shaped cross-section by the etching process. The blocking patterns 251 may be removed and the first conductive layer 241 may be conformally formed. The first conductive layer 241 may extend along the sidewalls and top surfaces of the first insulating patterns 281 and may contact the top surfaces of the switching patterns 221. The first conductive layer 241 may include at least one of W, Ti, Al, Cu, C, CN, TiN, TiAlN, TiSiN, TiCN, WN, CoSiN, WSiN, TaN, TaCN, and TaSiN.

Figure 18A:
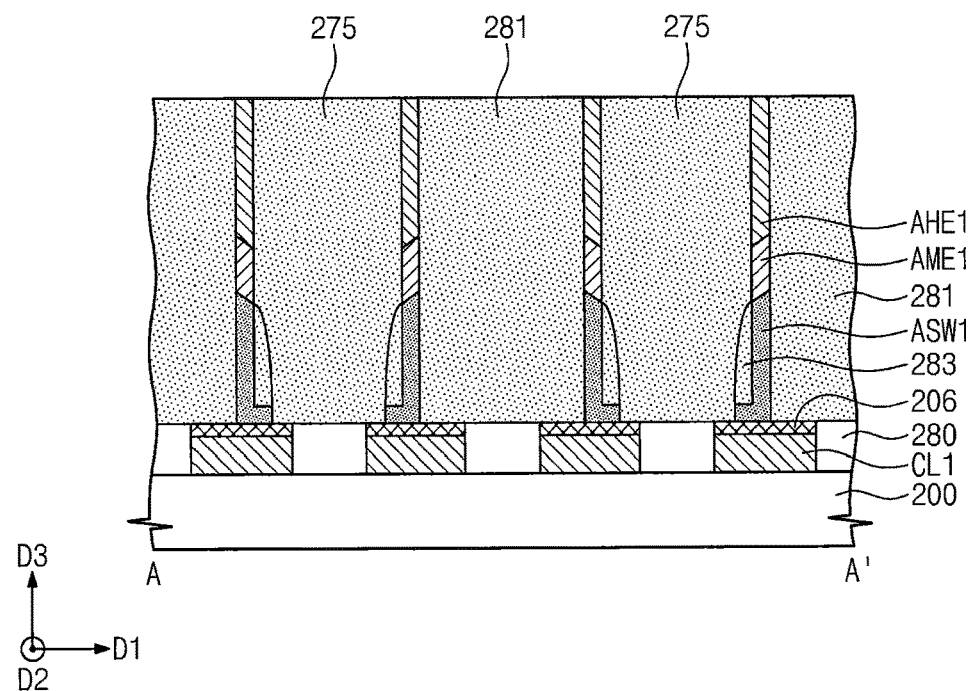
Figure 18B:
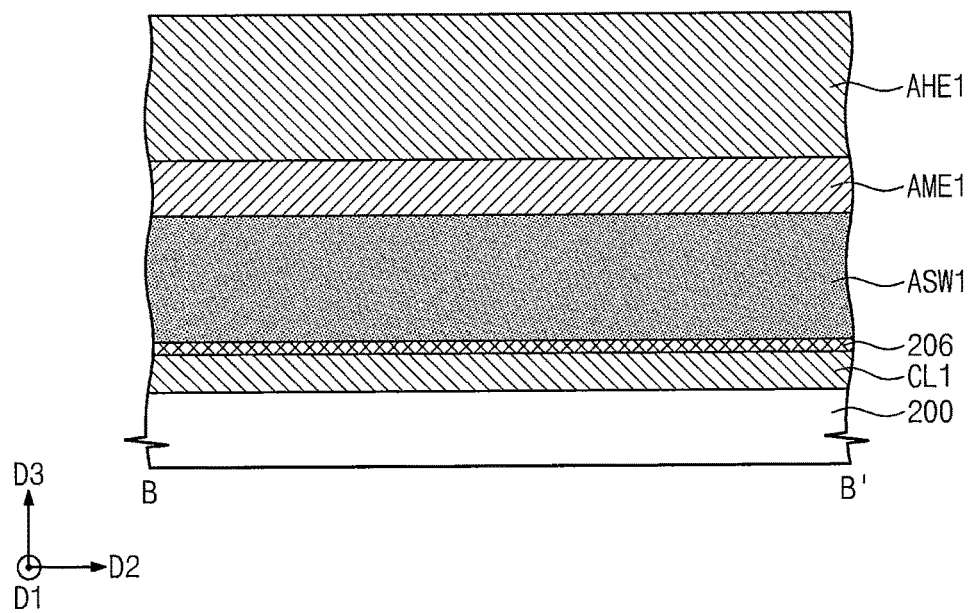

Referring to FIGS. 3, 18A, and 18B, an etch-back process may be performed on the first conductive layer 241 to form preliminary intermediate electrodes AME1. The preliminary intermediate electrodes AME1 may extend in the second direction D2 along the switching patterns 221. On a resulting structure in which the preliminary intermediate electrodes AME1 are formed, a second conductive layer may be formed and then an etch-back process may be performed, thereby forming preliminary first electrodes AHE1. The preliminary first electrodes AHE1 may include at least one of W, Ti, Al, Cu, C, CN, TiN, TiAlN, TiSiN, TiCN, WN, CoSiN, WSiN, TaN, TaCN, TaSiN, and TiO, for example.

An etching process on the second insulating layer 282 and the switching patterns 221 may be performed. As a result, second insulating patterns 283 spaced apart from each other in the first direction D1 may be formed and preliminary switching elements ASW1 spaced apart from each other in the first direction D1 may be formed. The preliminary switching elements ASW1 may extend in the second direction D2 along the first conductive lines CL1.

As described above, some surfaces (hereinafter, being un-etched surfaces UDS of the switching elements shown in FIGS. 5A and 5B) of the preliminary switching elements ASW1 may not be subject to etching damage. Since the surfaces of the preliminary switching elements ASW1 are covered by the second insulating patterns 283 during the etching process, a deterioration of switching characteristics of the switching elements, for example, changes in the surface composition due to etchant collision and/or variations of a crystallization temperature and/or of a threshold voltage of the switching elements due to inflow of etchant, may be prevented or reduced. The etching process may be performed without using a double patterning technology (DPT), so it may be possible to simplify the process.

Third insulating patterns 275 may be formed to fill the first trenches 291. The third insulating patterns 275 may be formed of the same material as the first insulating patterns 281.

Figure 19A:
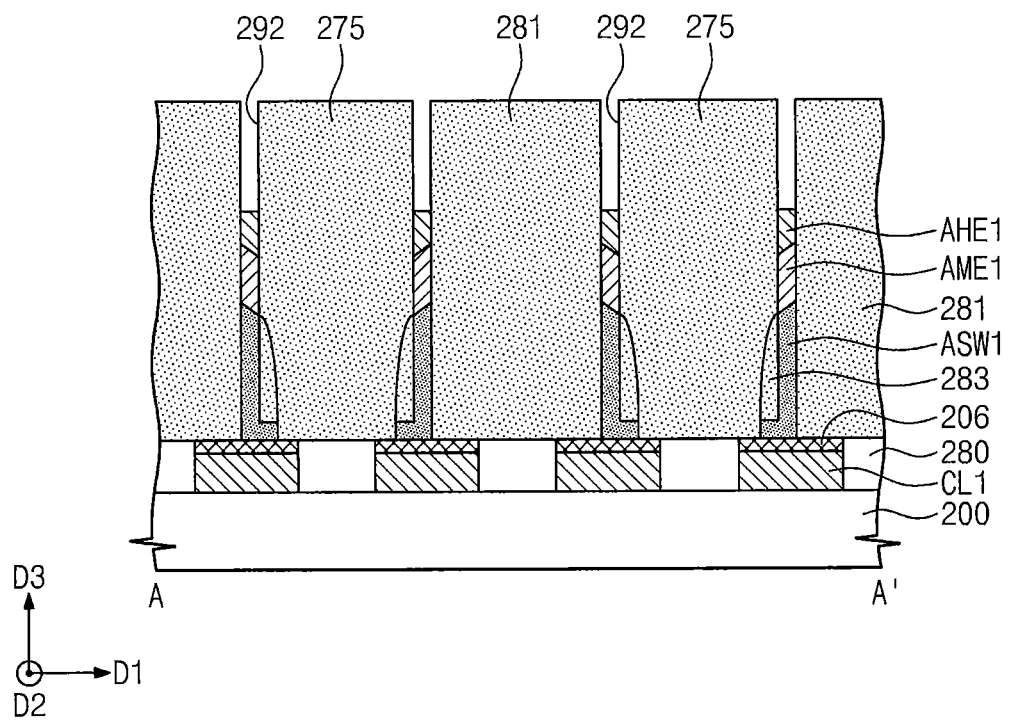
Figure 19B:
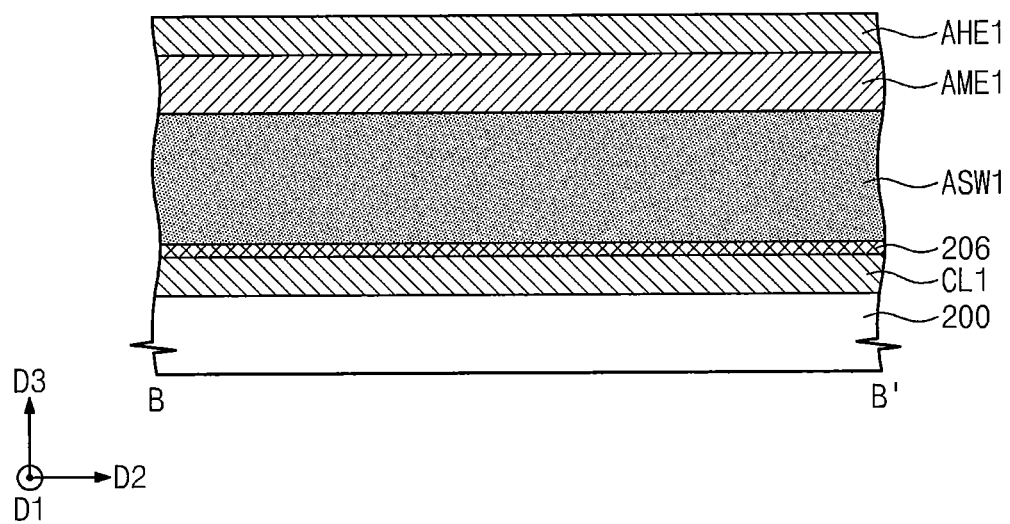

Referring to FIGS. 3, 19A, and 19B, upper portions of the preliminary first electrodes AHE1 may be removed to form second trenches 292. The second trenches 292 may be formed between the first insulating patterns 281 and the third insulating patterns 275. For example, the second trenches 292 may be defined by the first and third insulating patterns 281 and 275 and the preliminary first electrodes AHE1. The removal of the upper portions of the preliminary electrodes AHE1 may be performed by a selective etching process.

Figure 20A:
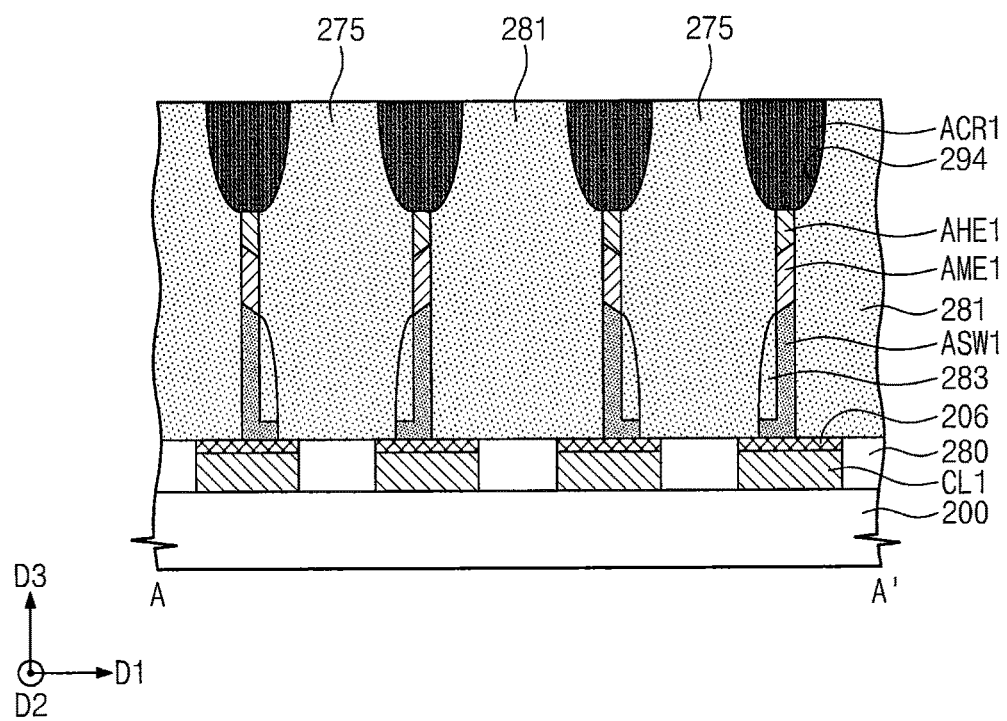
Figure 20B:
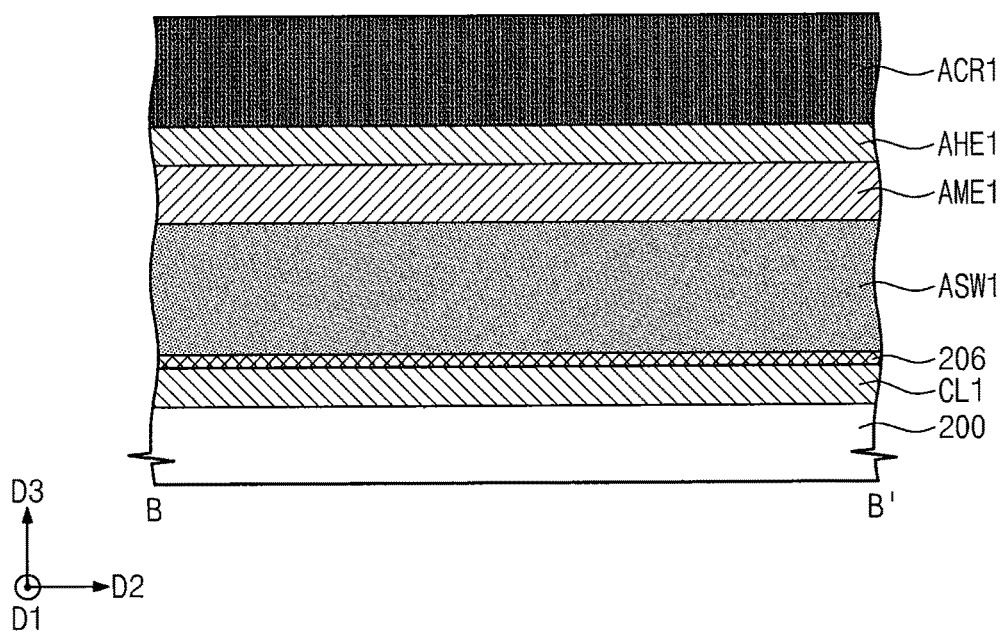

Referring to FIGS. 3, 20A, and 20B, the second trenches 292 may be enlarged to form recess regions 294. For example, the recess regions 294 may be formed by an isotropic wet etching process using phosphoric acid. Preliminary variable resistance structures ACR1 may be formed to fill the recess regions 294. The formation of the preliminary variable resistance structures ACR1 may include depositing a variable resistance material filling the recess regions 294 and performing a planarization process on the variable resistance material. In embodiments where the variable resistance memory device according to example embodiments of present inventive concepts is a phase change memory device, the preliminary variable resistance structures ACR1 may include a material capable of a reversible phase change between a crystalline phase and an amorphous phase. The preliminary variable resistance structures ACR1 may include a compound formed by a combination of at least one of chalcogen elements, for example, Te and Se, and at least one of Ge, Sb, Bi, Pb, Sn, Ag, As, S, Si, In, Ti, Ga, P, 0, and C. For example, the preliminary variable resistance structures ACR1 may include at least one of GeSbTe, GeTeAs, SbTeSe, GeTe, SbTe, SeTeSn, GeTeSe, SbSeBi, GeBiTe, GeTeTi, InSe, GaTeSe, and InSbTe. The variable resistance material may be formed by a physical vapor deposition (PVD) process or chemical vapor deposition (CVD) process.

Figure 21A:
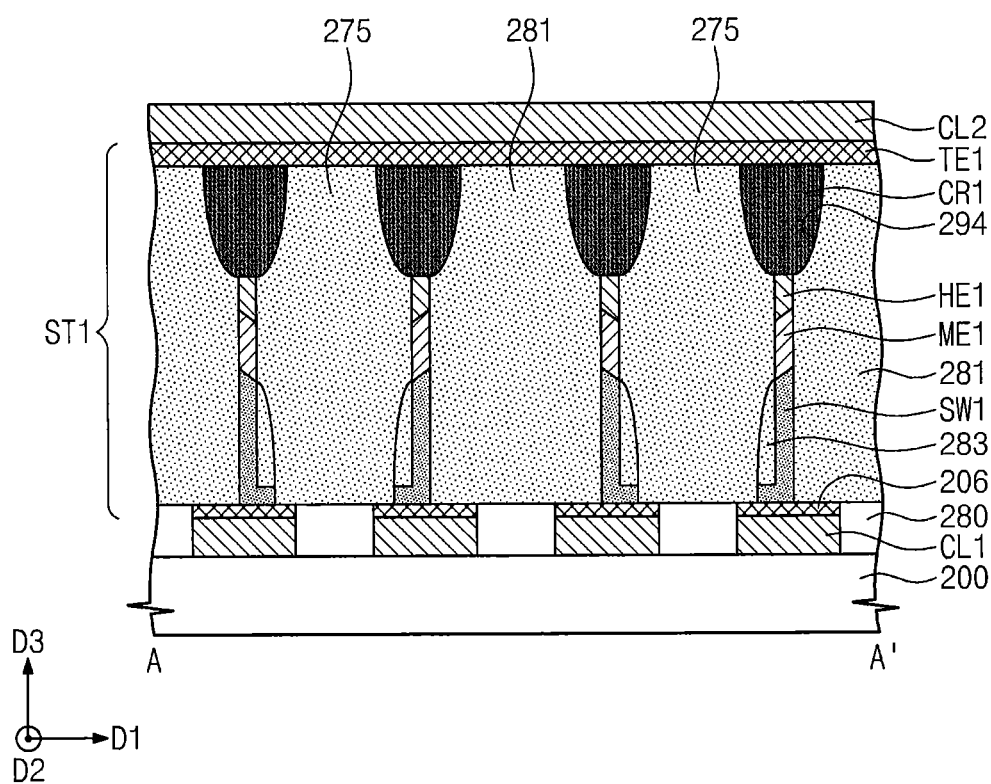
Figure 21B:
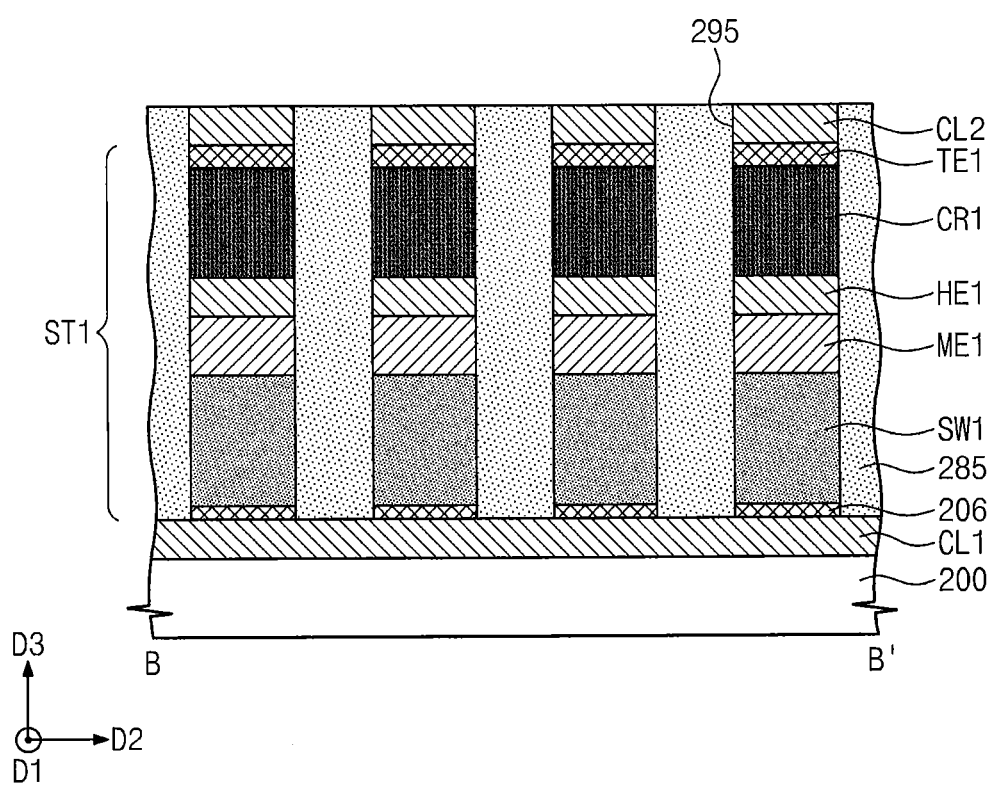

Referring to FIGS. 3, 21A, and 21B, second electrodes TE1 and second conductive lines CL2 may be sequentially formed on the preliminary variable resistance structures ACR1. The second electrodes TE1 and the second conductive lines CL2 may extend in the first direction D1. The second electrodes TE1 and the second conductive lines CL2 may be respectively spaced apart from each other in the second direction D2. The second electrodes TE1 may include at least one of W, Ti, Al, Cu, C, CN, TiN, TiAlN, TiSiN, TiCN, WN, CoSiN, WSiN, TaN, TaCN, and TaSiN.

The preliminary variable resistance structures ACR1, the preliminary first electrodes AHE1, the preliminary intermediate electrodes AME1, and the preliminary switching elements ASW1 may be patterned to form variable resistance structures CR1, first electrodes HE1, intermediate electrodes ME1, and switching elements SW1 which are respectively spaced apart from each other in the second direction D2. Furthermore, the barrier patterns 206 may be patterned to be spaced apart from each other in the second direction D2. As an example, the patterning process may be performed using the same mask pattern as used for the patterning process of forming the second electrodes TE1 and the second conductive lines CL2. In this case, in the second direction D2, sidewalls of the second electrodes TE1, the second conductive lines CL2, the variable resistance structures CR1, the first electrodes HE1, the intermediate electrodes ME1, the switching elements SW1, and the barrier patterns 206 may be vertically aligned and may define third trenches 295. The third trenches 295 may be filled with fourth insulating patterns 285. The fourth insulating patterns 285 may include at least one of silicon oxide, silicon nitride, and silicon oxynitride. By the patterning process, a first cell stack ST1 may be completed. The first cell stack ST1 may include memory cells which are disposed at respective intersections of the first lines CL1 and the second conductive line CL2 and may include the barrier patterns 206, the switching elements SW1, the intermediate electrodes ME1, the first electrodes HE1, the variable resistance structures CR1, and the second electrodes TE1

Referring again to FIGS. 3, 15A and 15B, a second cell stack ST2 may be formed on the second conductive lines CL2. The second cell stack ST2 may be formed by using substantially the same processes as used for forming the first cell stack ST1. As an example, the second cell stack ST2 may include barrier patterns 208, switching elements SW2, intermediate electrodes ME2, first electrodes HE2, variable resistance structures CR2, and second electrodes TE2 which are sequentially formed on the second conductive lines CL2. However, the second cell stack ST2 may be formed to have a structure in which the first cell stack ST1 is rotated by about 90 degrees relative to a central axis parallel to the third direction D3 in a plan view. A configuration of an A-A' cross-section of the second cell stack ST2 may correspond to that of a B-B' cross-section of the first cell stack ST1, and a configuration of a B-B' cross-section of the second cell stack ST2 may correspond to that of an A-A' cross-section of the first cell stack ST1.

Third conductive lines CL3 may be provided on the second cell stack ST2. The third conductive lines CL3 may extend in a direction parallel to an extension direction of the first conductive lines CL1 (or in the second direction D2) and may be spaced apart from each other in a direction parallel to an extension direction of the second conductive lines CL2 (or in the first direction D1). The third conductive lines CL3 may be vertically spaced apart from the second conductive lines CL2.

According to example embodiments of present inventive concepts, the barrier patterns 206, the switching elements SW1, the intermediate electrodes ME1, the first electrodes HE1, the variable resistance structures CR1, and the second electrodes TE1 may be formed to be vertically aligned. In addition, some surfaces of each of the switching elements SW1 may not be subject to etching damage, thereby preventing or reducing a deterioration of electrical characteristics of the switching elements SW1.

Figure 22A:
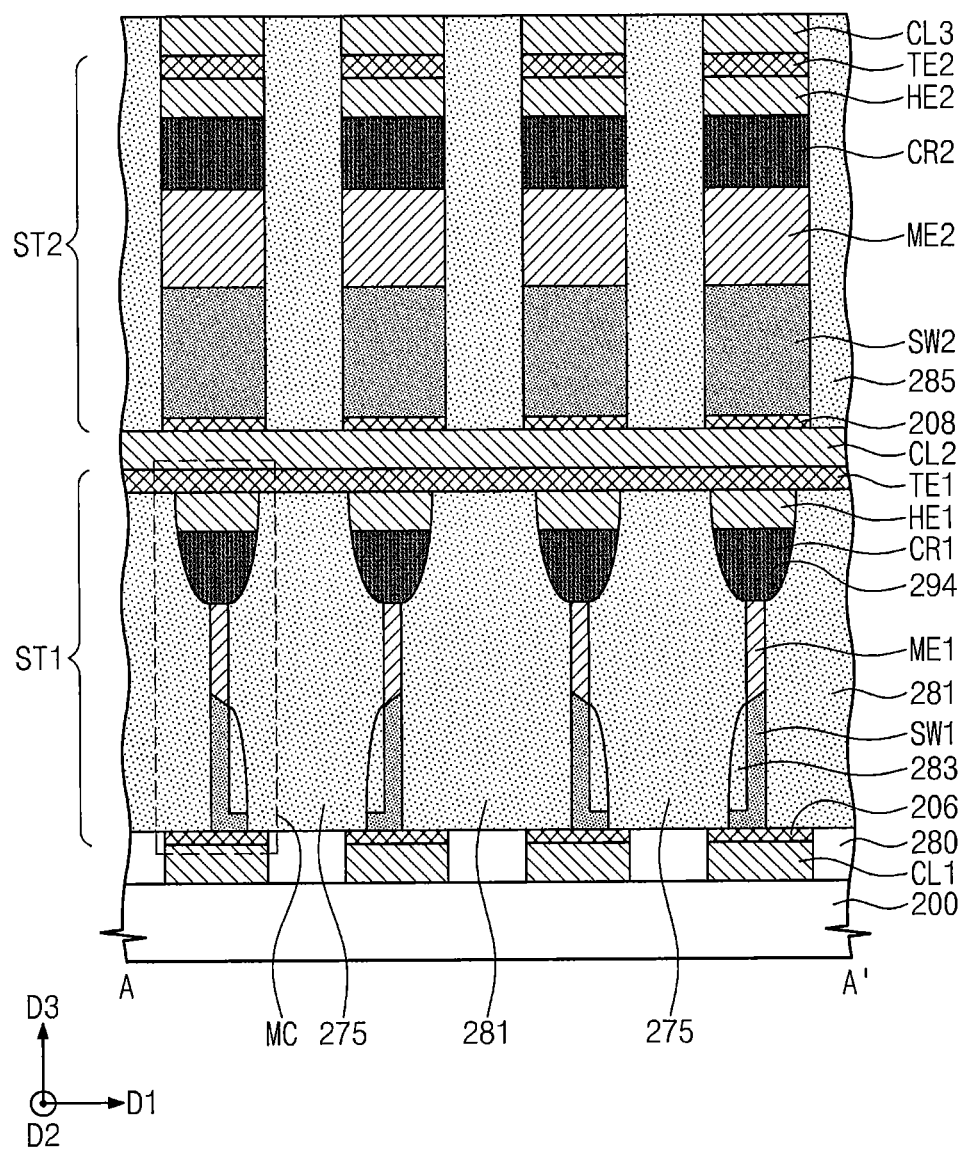
FIGS. 22A and 22B illustrate a variable resistance memory device according to example embodiments of present inventive concepts and are cross-sectional views taken along lines A-A' and B-B' of FIG. 3, respectively.
Figure 22B:
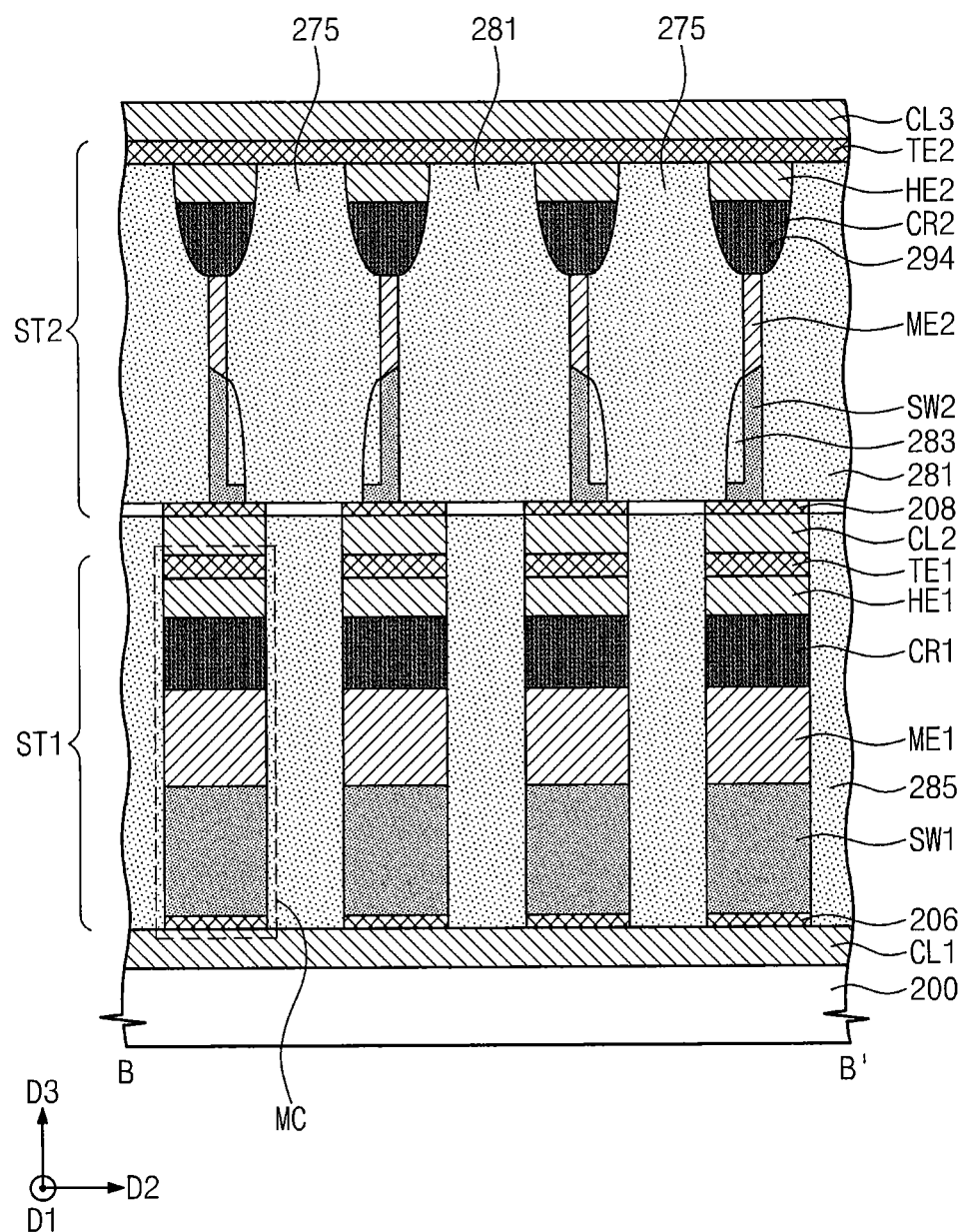

FIGS. 22A and 22B illustrate a variable resistance memory device according to example embodiments of present inventive concepts and are cross-sectional views taken along lines A-A' and B-B' of FIG. 3, respectively. For the sake of brevity, duplicate descriptions of previously-illustrated features/elements herein may be briefly given or omitted.

Referring to FIGS. 3, 22A and 22B, a first cell stack ST1 and a second cell stack ST2 may be stacked on the substrate 200. The first cell stack ST1 may be disposed between first conductive lines CL1 and second conductive lines CL2 which are sequentially provided on the substrate 200 to be vertically spaced apart from each other. The first cell stack ST1 may include memory cells MC which are positioned at respective intersections of the first conductive lines CL1 and the second conductive lines CL2. The memory cells MC may each include a variable resistance structure CR1 and a switching element SW1. The memory cells MC may each include an intermediate electrode ME1 between the variable resistance structure CR1 and the switching element SW1.

The intermediate electrodes ME1 may be in contact with bottom surfaces of the variable resistance structures CR1. Second electrodes TE1 may be disposed between the variable resistance structures CR1 and the second conductive lines CL2.

First electrodes HE1 may be disposed between the variable resistance structures CR1 and the second electrodes TE1. The first electrodes HE1 may function as heater electrodes for heating the variable resistance structures so as to change phases of the variable resistance structures CR1. The first electrodes HE1 may be disposed in upper portions of recess regions 294 and lower portions of the recess regions 294 may be occupied by the variable resistance structures CR1. After the variable resistance structures CR1 each are formed to fill a portion of each of the recess regions 294, the first electrodes HE1 may be formed by depositing an electrode material to fill remaining portions of the recess regions 294. The other configurations except for a position, a structure and a forming method of the first electrodes HE1 and HE2 may be the same as described with reference to FIGS. 15A and 15B.

Figure 23A:
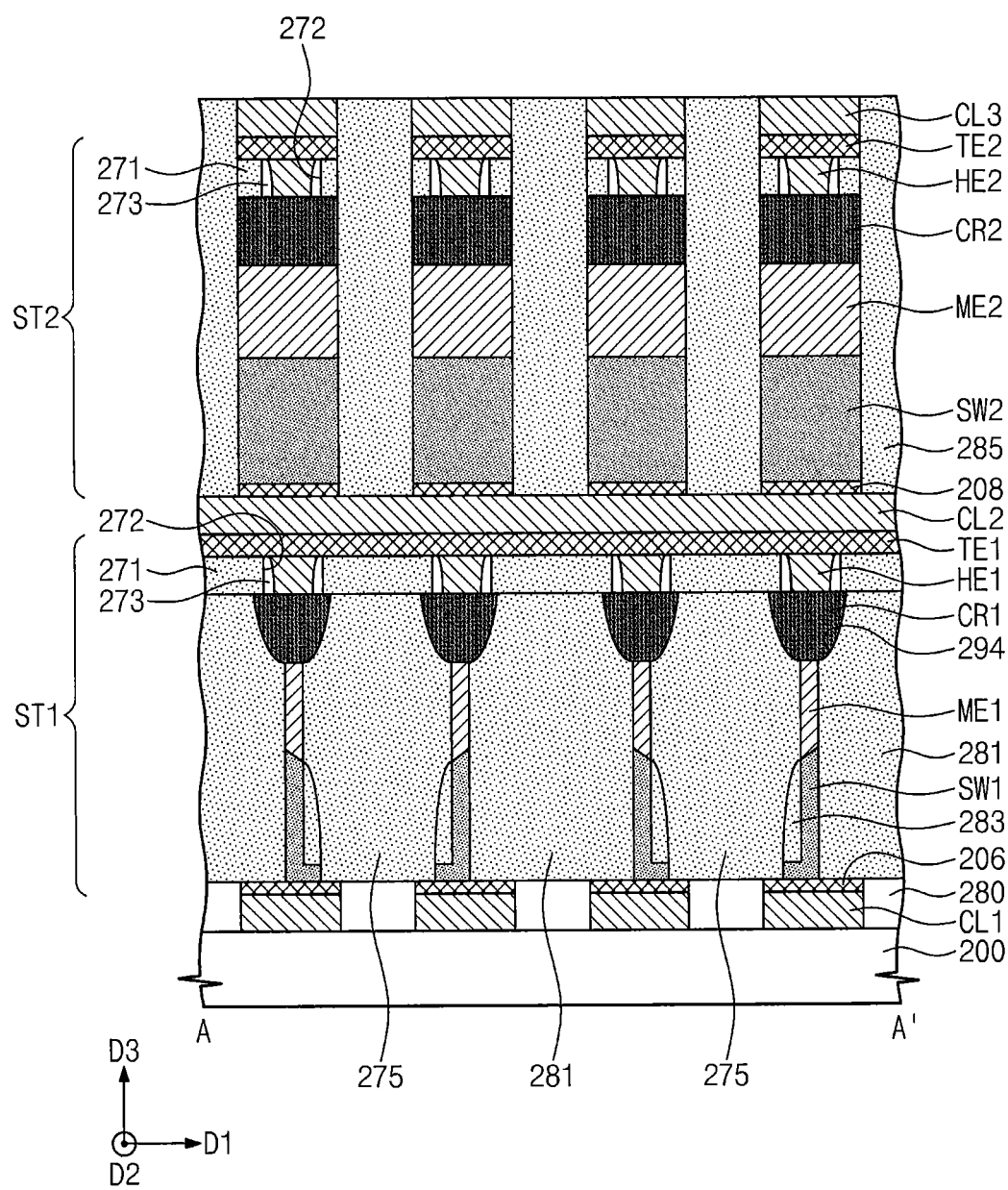

FIGS. 23A and 23B illustrate a variable resistance memory device according to example embodiments of present inventive concepts and are cross-sectional views taken along lines A-A' and B-B' of FIG. 3, respectively. For the sake of brevity, duplicate descriptions of previously-illustrated features/elements herein may be briefly given or omitted.

Referring to FIGS. 3, 23A, and 23B, the intermediate electrodes ME1 may be in contact with bottom surfaces of the variable resistance structures CR1. Second electrodes TE1 may be disposed between the second conductive lines CL2 and the variable resistance structures CR1.

First electrodes HE1 may be disposed between the variable resistance structures CR1 and the second electrodes TE1. The first electrodes HE1 may be formed in a third interlayer insulating layer 271. For example, the first electrodes HE1 may be disposed in contact holes 272 formed in the third interlayer insulating layer 271 and exposing top surfaces of the variable resistance structures CR1. Insulating spacers 273 may be disposed between the first electrodes HE1 and the third interlayer insulating layer 271. The insulating spacers 273 may be disposed on sidewalls of the contact holes 272 and may cover the sidewalls of the first electrodes HE1.

The other configurations except for a position, a structure and a forming method of the first electrodes HE1 and HE2 may be the same as described with reference to FIGS. 15A and 15B.

Figure 24A:
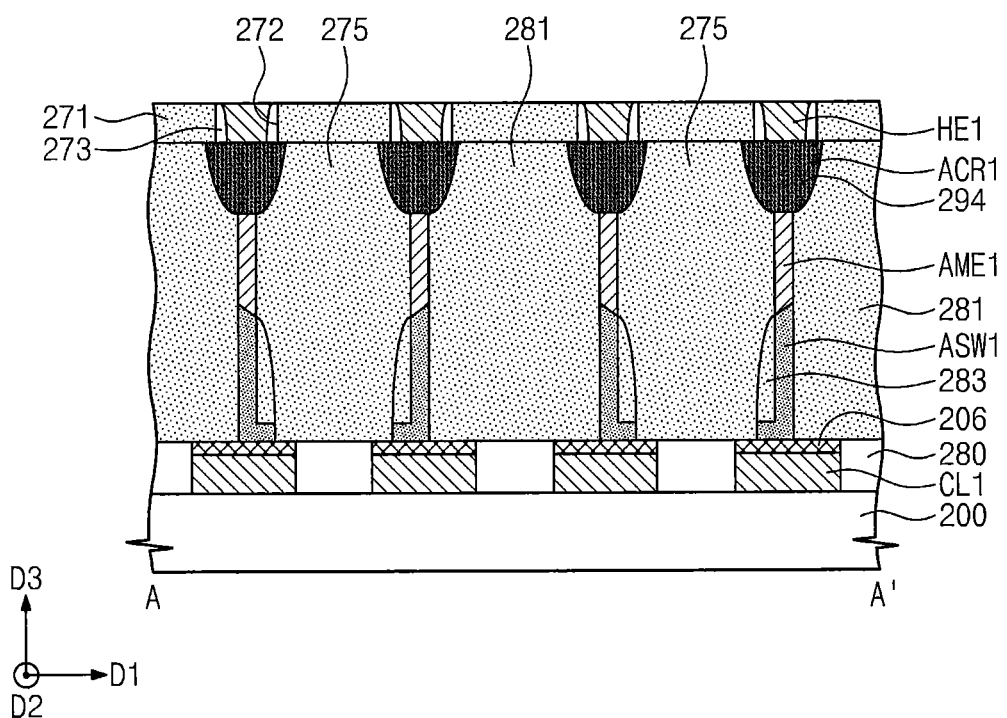
FIGS. 24A and 25A illustrate a method of manufacturing a variable resistance memory device according to example embodiments of present inventive concepts and are cross-sectional views taken along line A-A' of FIG. 3, respectively.
Figure 24B:
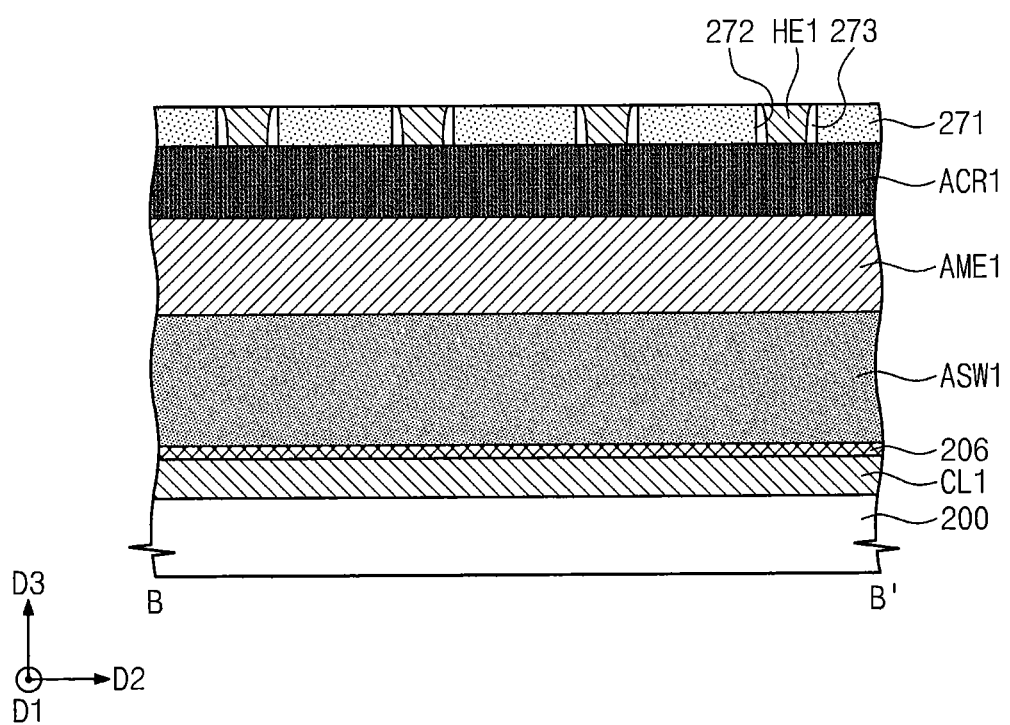
FIGS. 24B and 25B illustrate a method of manufacturing a variable resistance memory device according to example embodiments of present inventive concepts and are cross-sectional views taken along line B-B' of FIG. 3, respectively.
Figure 25A:
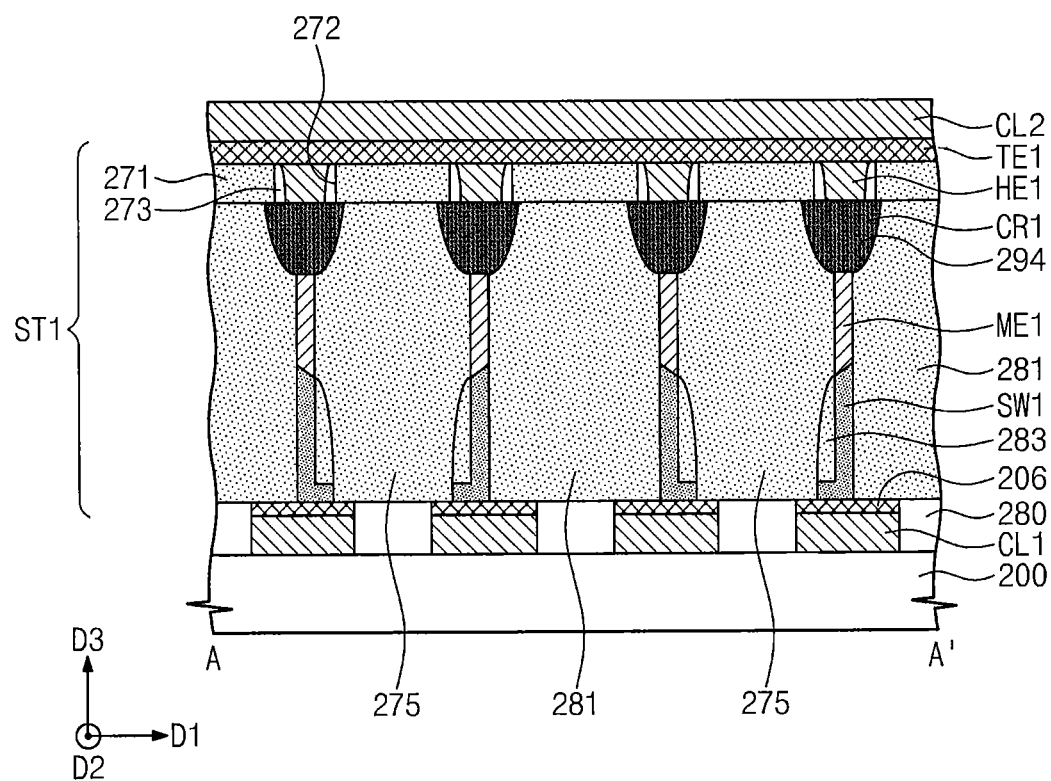
Figure 25B:
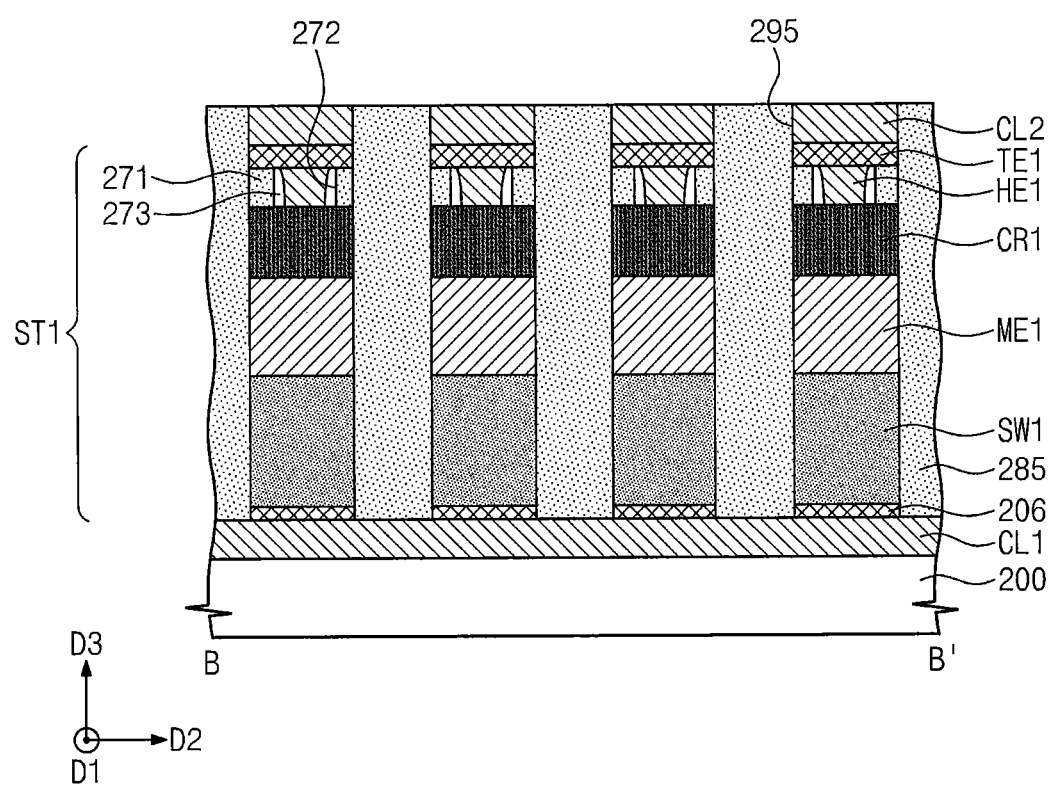

FIGS. 24A and 25A illustrate a method of manufacturing a variable resistance memory device according to example embodiments of present inventive concepts and are cross-sectional views taken along line A-A' of FIG. 3, respectively. FIGS. 24B and 25B illustrate a method of manufacturing a variable resistance memory device according to example embodiments of present inventive concepts and are cross-sectional views taken along line B-B' of FIG. 3, respectively. For the sake of the brevity, duplicate descriptions of previously-illustrated features/elements herein may be briefly given or omitted.

Referring to FIGS. 3, 24A and 24B, conductive lines CL1, barrier patterns 206, preliminary switching elements ASW1, preliminary intermediate electrodes AME1, preliminary variable resistance structures ACR1, a first interlayer insulating layer 280, and first through third insulating patterns 281, 283 and 275 may be formed on a substrate 200, as described with reference to FIGS. 16A through 20B. A third interlayer insulating layer 271 may be formed on the preliminary variable resistance structures ACR1. The third interlayer insulating layer 271 may include at least one of silicon oxide, silicon nitride, and silicon oxynitride. Contact holes 272 may be formed in the third interlayer insulating layer 271 to expose top surfaces of the preliminary variable resistance structures ACR1. Insulating spacers 273 may be formed on sidewalls of the contact holes 272. First electrodes HE1 may be formed to fill the contact holes 272. The first electrodes HE1 may be spaced apart from each other in the first and second directions D1 and D2.

Referring to FIGS. 3, 25A and 25B, second electrodes TE1 and second conductive lines CL2 may be sequentially formed on the first electrodes HE1 to respectively extend in the first direction D1 and be respectively spaced apart from each other in the second direction D2.

The preliminary variable resistance structures ACR1, the preliminary intermediate electrodes AME1, and the preliminary switching elements ASW1 may be patterned to form variable resistance structures CR1, intermediate electrodes ME1, and switching elements SW1 which are respectively spaced apart from each other in the second direction D2. For example, the patterning process may be performed using the same mask pattern as used for a patterning process of forming the second electrodes TE1 and the second conductive lines CL2. Third trenches 295 may be formed by the patterning process, and the first electrodes HE1 may be separated from each other by the third trenches 295 in the second direction D2. Fourth insulating patterns 285 may be formed to fill the trenches 295. By the patterning process, a first cell stack ST1 may be completed.

Referring again to FIGS. 3, 23A, and 23B, a second cell stack ST2 may be formed on the second conductive lines CL2. The second cell stack ST2 may be formed by using substantially the same processes as used for forming the first cell stacks ST1. However, the second cell stack ST2 is formed to have a structure in which the first cell stack ST1 is rotated by about 90 degrees relative to a central axis parallel to the third direction D3 in a plan view. Third conductive lines CL3 may be formed on the second cell stack ST2.

Figure 26A:
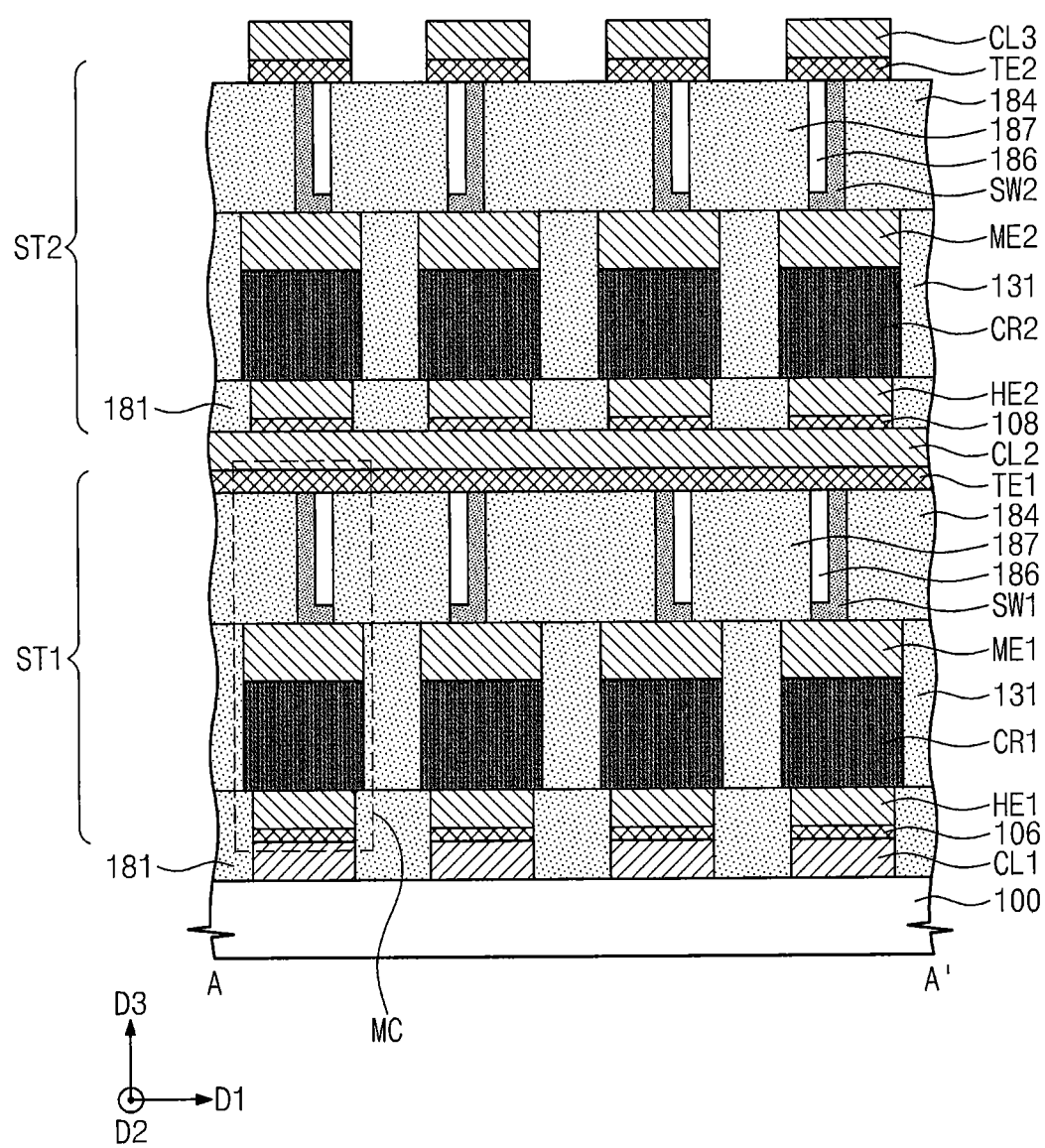
FIGS. 26A and 26B illustrate a variable resistance memory device according to example embodiments of present inventive concepts and are cross-sectional views taken along lines A-A' and B-B' of FIG. 3, respectively.
Figure 26B:
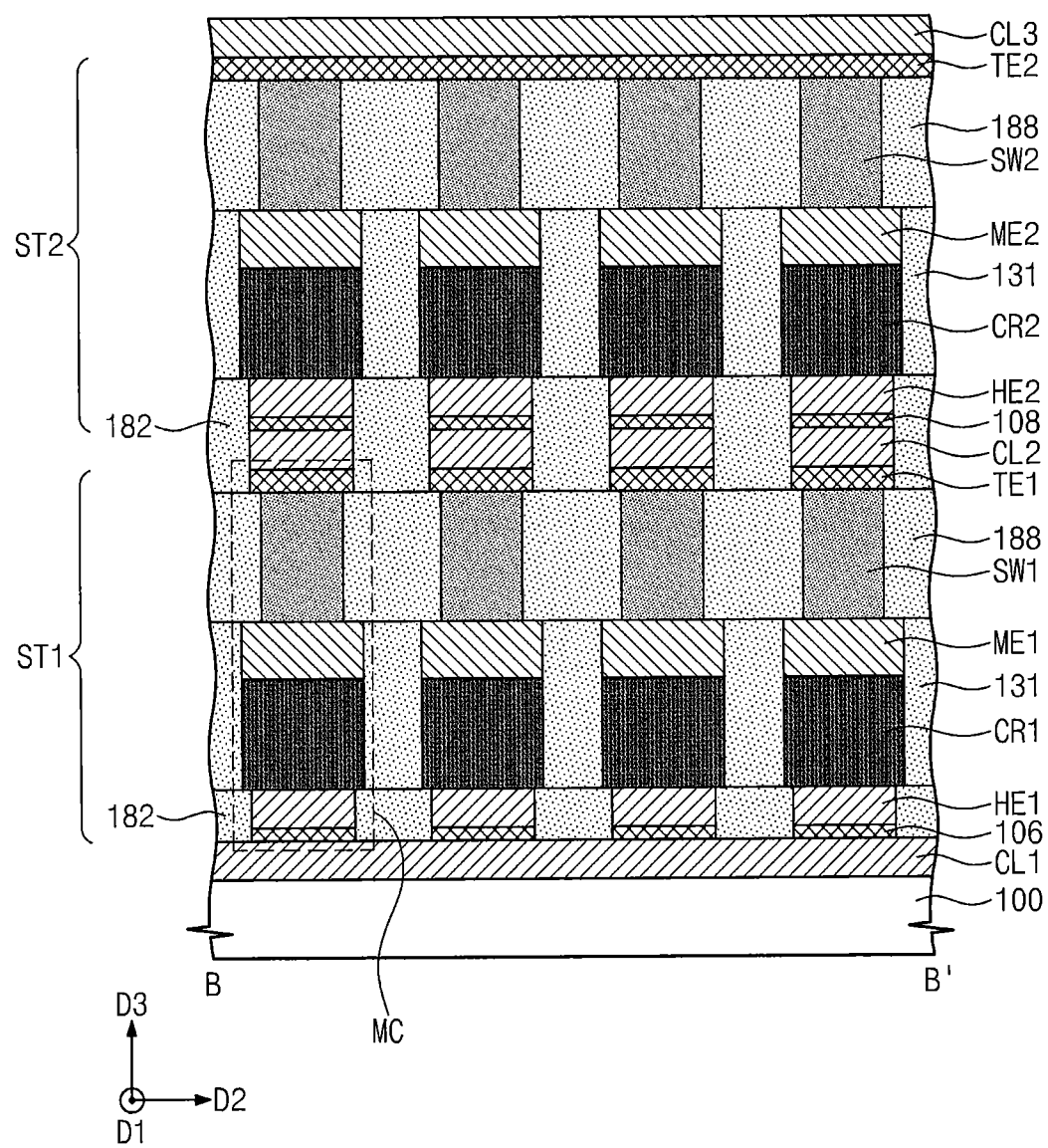

FIGS. 26A and 26B illustrate a variable resistance memory device according to example embodiments of present inventive concepts and are cross-sectional views taken along lines A-A' and B-B' of FIG. 3, respectively. For the sake of the brevity, duplicate descriptions of previously-illustrated features/elements herein may be briefly given or omitted.

Referring to FIGS. 3, 26A and 26B, a first cell stack ST1 and a second cell stack ST2 may be stacked on a substrate 100. The first cell stack ST1 may include barrier patterns 106, first electrodes HE1, variable resistance structures CR1, intermediate electrodes ME1, switching elements SW1, and second electrodes TE1 which are formed on first conductive lines CL1. The variable resistance structures CR1 may be disposed in a fourth interlayer insulating layer 131 on a first and second interlayer insulating layers 181 and 182 and the first electrodes HE1 and may be in contact with the fourth interlayer insulating layer 131 without spacers therebetween. The first conductive lines CL1, the barrier patterns 106, and the first electrodes HE1 under the variable resistance structures CR1 may be respectively isolated from each other by the first interlayer insulating layer 181 in the second direction D2. The barrier patterns 106 and the first electrodes HE1 may be respectively isolated from each other by the second insulating layer 182 in the first direction D1. The formation of the variable resistance structures CR1 may include conformally forming a variable resistance layer on the first and second interlayer insulating layers 181 and 182 and the first electrodes HE1 and performing a patterning process on the variable resistance layer. After the patterning process is performed, the fourth interlayer insulating layer 131 may be formed to fill between the variable resistance structures CR1. The intermediate electrodes ME1 may be formed by concurrently patterning a material for forming the intermediate electrodes ME1 during the patterning process for forming the variable resistance structures CR1 thereunder, or may be formed by a separate process (e.g., a deposition process and a patterning process of the material for forming the intermediate electrodes ME1) from the process of forming the variable resistance structures CR1. The switching elements SW1 may be formed on the intermediate electrodes ME1. The second electrodes TE1 and second conductive lines CL2 crossing the first conductive lines CL1 may be sequentially formed on the switching elements SW1 and insulating patterns 184, 186, 187, and 188. The second cell stack ST2 may be formed on the second conductive lines CL2 using substantially the same processes as used for forming the first cell stack ST1.

The variable resistance structures CR1 and CR2 may be spaced apart from each other in the first and second directions D1 and D2, but are not limited thereto. For example, the variable resistance structures CR1 and CR2 may extend in the first direction D1 or in the second direction D2 as described with reference to FIGS. 13, 14A, and 14B.

Figure 27A:
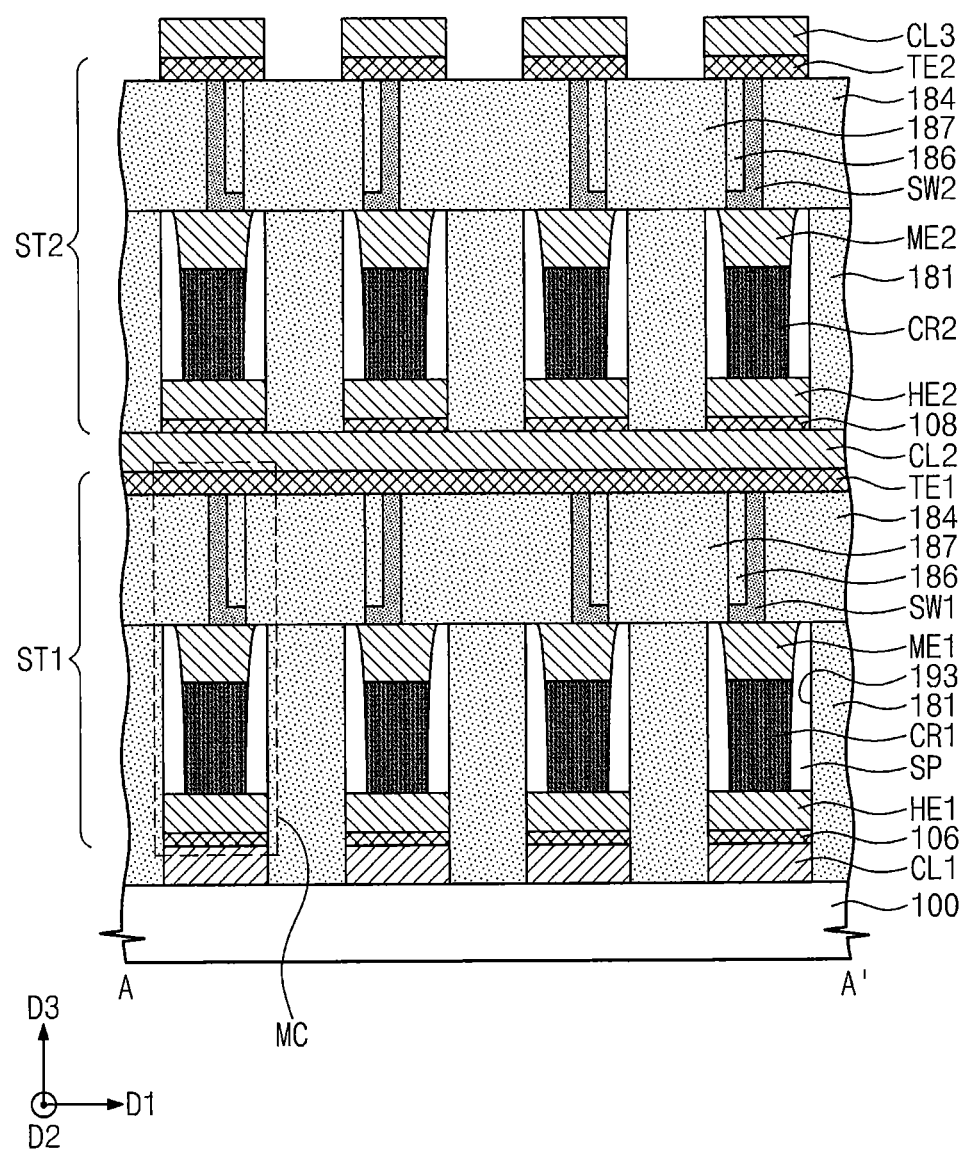
FIGS. 27A and 27B illustrate a variable resistance memory device according to example embodiments of present inventive concepts and are cross-sectional views taken along lines A-A' and B-B' of FIG. 3, respectively.
Figure 27B:
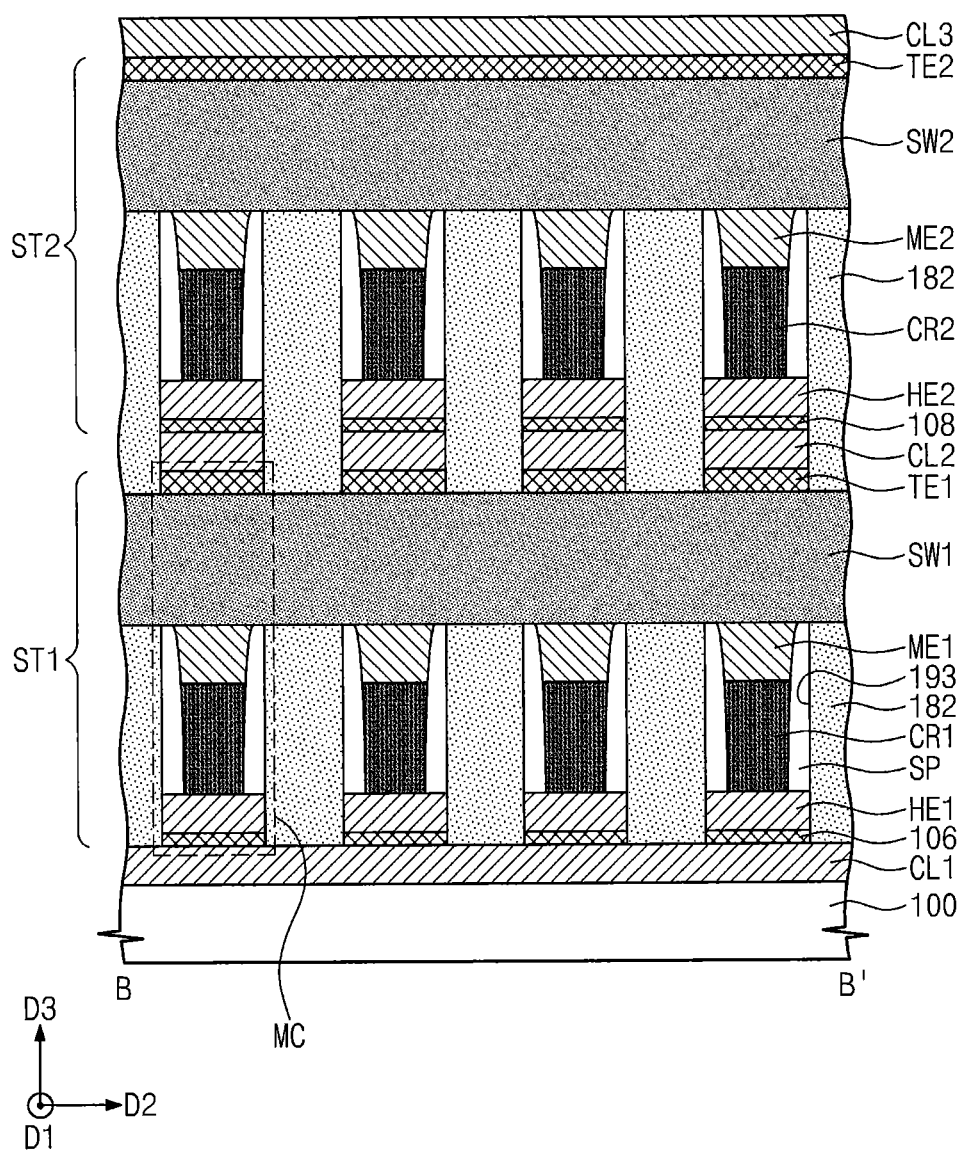

FIGS. 27A and 27B illustrate a variable resistance memory device according to example embodiments of present inventive concepts and are cross-sectional views taken along lines A-A' and B-B' of FIG. 3, respectively. For sake of the brevity, duplicate descriptions of previously-illustrated features/elements herein may be briefly given or omitted.

Referring to FIGS. 3, 27A, and 27B, switching elements SW1 of a first cell stack ST1 may each have a linear shape extending in one direction. For example, the switching elements SW1 may extend in the second direction D2 and may be spaced apart from each other in the first direction D1. Such a structure may be formed by omitting the patterning process of the preliminary switching elements as described with reference to FIGS. 11A and 11B.

Switching elements SW2 of a second cell stack ST2 may be formed by using substantially the same process as used for forming the switching elements SW1 of the first cell stack ST1. The switching elements SW2 of the second cell stack ST2 may extend in the second direction D2 and may be spaced apart from each other in the first direction D1. In some embodiments, the switching elements SW2 of the second cell stack ST2 may have a linear shape extending in a different direction from the switching elements SW1 of the first cell stack ST1. For example, the switching elements SW1 of the first cell stack ST1 may each extend in the second direction D2, and the switching elements SW2 of the second cell stack ST2 may each extend in the first direction D1.

According to example embodiments of present inventive concepts, a change of a crystallization temperature and/or a threshold voltage of each of the switching elements is prevented or reduced due to the un-etched surfaces of each of the switching elements, thus providing the variable resistance memory devices with improved reliability.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A variable resistance memory device, comprising:
   first conductive lines extending in a first direction;
   second conductive lines extending in a second direction that intersects the first direction, wherein the second conductive lines are spaced apart from the first conductive lines in a third direction that is perpendicular to the first and second directions; and
   first switching elements and first variable resistance structures between the first conductive lines and the second conductive lines, wherein the first switching elements are spaced apart from the first variable resistance structures in the third direction,
   wherein the first switching elements each comprise a first portion extending in the third direction and a second portion extending in the first direction or the second direction,
   wherein each of the first switching elements is bisected at a center line of the each of the first switching elements along the third direction into opposite sides that are asymmetrical with each other,
   wherein the first portion comprises a first sidewall and a second sidewall opposite to the first sidewall, and
   wherein an entirety of the first sidewall is substantially flat and the second portion protrudes from the second sidewall.

2. The variable resistance memory device of claim 1, further comprising insulating spacers on the first switching elements,
   wherein a pair of adjacent ones of the first switching elements are mirror-symmetrical with respect to the third direction,
   wherein first and second ones of the insulating spacers on the pair of adjacent ones of the first switching elements face each other and are spaced apart from each other,
   wherein the variable resistance memory device further comprises a substrate comprising the first switching elements thereon,
   wherein the variable resistance memory device further comprises an insulating pattern between the first and second ones of the insulating spacers,
   wherein the insulating pattern is thicker than the first and second ones of the insulating spacers in the third direction, and
   wherein a lowermost surface of the insulating pattern is closer than lowermost surfaces of the first and second ones of the insulating spacers to a surface of the substrate.

3. The variable resistance memory device of claim 1, further comprising:
   intermediate electrodes between the first switching elements and the first variable resistance structures.

4. The variable resistance memory device of claim 3,
   wherein the first variable resistance structures are between the second conductive lines and the first switching elements, and
   wherein an upper surface of the first portion contacts one of the intermediate electrodes.

5. The variable resistance memory device of claim 3, further comprising heater electrodes between the first conductive lines and the first variable resistance structures, the heater electrodes comprising a higher resistivity than the intermediate electrodes,
wherein the first switching elements partially expose respective top surfaces of the intermediate electrodes.

6. The variable resistance memory device of claim 3, wherein sidewalls of the intermediate electrodes are aligned in the third direction with the first and second sidewalls of the first switching elements.

7. The variable resistance memory device of claim 3, further comprising heater electrodes between the second conductive lines and the first variable resistance structures, the heater electrodes comprising a higher resistivity than the intermediate electrodes.

8. The variable resistance memory device of claim 3, wherein a cross-section of each of the first variable resistance structures comprises a width that tapers toward the intermediate electrodes, and
wherein respective interfaces between the intermediate electrodes and the first switching elements are sloped.

9. The variable resistance memory device of claim 1, further comprising:
third conductive lines spaced apart from the first conductive lines in the third direction, wherein the second conductive lines are between the first and third conductive lines; and
second switching elements and second variable resistance structures between the second conductive lines and the third conductive lines, wherein the second switching elements are spaced apart from the second variable resistance structures in the third direction.

10. The variable resistance memory device of claim 1, wherein the first variable resistance structures each are commonly connected to a plurality of the first switching elements.

11. The variable resistance memory device of claim 1,
wherein the first switching elements comprise a compound comprising at least one of Tellurium (Te) and Selenium (Se) and at least one of Germanium (Ge), Antimony (Sb), Bismuth (Bi), Aluminum (Al), Lead (Pb), Tin (Sn), Silver (Ag), Arsenic (As), Sulfur (S), Silicon (Si), Indium (In), Titanium (Ti), Gallium (Ga), and Phosphorus (P),
wherein the first switching elements further comprise at least one of Carbon (C), Nitrogen (N), and Oxygen (O),
wherein a first phase change temperature between a crystalline phase and an amorphous phase of the first switching elements is higher than a second phase change temperature between a crystalline phase and an amorphous phase of the first variable resistance structures,
wherein the first switching elements are at respective intersections of the first conductive lines and the second conductive lines, and
wherein the first switching elements are spaced apart from each other in the first and second directions.

12. The variable resistance memory device of claim 1,
wherein the first switching elements each comprise an L-shaped cross-section, and
wherein a portion of the first sidewall overlaps the second portion in the first direction or the second direction.

13. A variable resistance memory device, comprising:
first conductive lines extending in a first direction;
second conductive lines and third conductive lines extending in a second direction that intersects the first direction, wherein the second and third conductive lines are spaced apart from each other in a third direction that is perpendicular to the first and second directions, and wherein the first conductive lines are between the second and third conductive lines;
first switching elements between the first conductive lines and the second conductive lines;
second switching elements between the first conductive lines and the third conductive lines; and
variable resistance structures between the first conductive lines and the second conductive lines and between the first conductive lines and the third conductive lines,
wherein each of the first switching elements comprises an upper portion and a lower portion,
wherein the upper portion extends from the lower portion in the third direction,
wherein the upper portion comprises a first width that is narrower in the first direction than a second width in the first direction of the lower portion, and
wherein the second width is narrower than a third width in the first direction of the second switching elements.

14. The variable resistance memory device of claim 13, wherein a fourth width in the second direction of the second switching elements is narrower than a fifth width in the second direction of the first switching elements.

15. The variable resistance memory device of claim 13, further comprising a barrier pattern between the second conductive lines and the first switching elements.

16. A variable resistance memory device comprising:
first and second conductive lines;
a memory cell comprising a stack that comprises a variable resistance material and a switching element between the first and second conductive lines, the switching element comprising an un-etched first surface facing a first direction and an un-etched second surface facing a second direction that intersects the first direction, wherein a widest portion of the switching element is narrower than a widest portion of the variable resistance material in the first direction, and wherein the switching element is bisected at a center line of the switching element along the second direction into opposite sides that are asymmetrical with each other; and
an insulating material on the un-etched first and second surfaces of the switching element.

17. The variable resistance memory device of claim 16,
wherein the switching element undercuts the insulating material, and
wherein the insulating material is thinner in each of the first and second directions than the switching element.

18. The variable resistance memory device of claim 16, wherein one of the un-etched first and second surfaces of the switching element comprises a non-planar surface that is free of etching damage.

19. The variable resistance memory device of claim 16, further comprising a substrate, wherein:
the stack is on the substrate;
the switching element comprises an Ovonic Threshold Switch (OTS) element between the variable resistance material and the substrate;
the memory cell comprises a first memory cell; and
the variable resistance memory device further comprises a second memory cell stacked on the first memory cell.

20. The variable resistance memory device of claim 16, further comprising an electrode between the switching element and the variable resistance material,
wherein a cross-section of the variable resistance material comprises a width that tapers toward the electrode, and wherein an interface between the electrode and the switching element is sloped.

\* \* \* \* \*